United States Patent [19]

Shimoda

[11] Patent Number: 5,623,447
[45] Date of Patent: Apr. 22, 1997

[54] SEMICONDUCTOR MEMORY DEVICE HAVING A PLURALITY OF I/O TERMINAL GROUPS

[75] Inventor: Masaki Shimoda, Hyogo, Japan

[73] Assignee: Mitsubishi Denki Kabushiki Kaisha, Tokyo, Japan

[21] Appl. No.: 597,822

[22] Filed: Feb. 7, 1996

[30] Foreign Application Priority Data

Feb. 28, 1995  [JP]  Japan ..................................... 7-40116

[51] Int. Cl.⁶ .................................................. G11C 7/00
[52] U.S. Cl. ............................... 364/189.04; 365/189.05; 365/233
[58] Field of Search ............................. 365/233, 189.01, 365/189.04, 189.05, 233.5

[56] References Cited

U.S. PATENT DOCUMENTS

| | | | |
|---|---|---|---|
| 5,204,841 | 4/1993 | Chappell et al. | 365/189.05 |
| 5,276,842 | 1/1994 | Sugita | 365/189.04 |
| 5,315,560 | 5/1994 | Nishimoto et al. | 365/189.05 |
| 5,541,886 | 7/1996 | Hasbun | 365/189.04 |

FOREIGN PATENT DOCUMENTS

| | | |
|---|---|---|
| 3-283081 | of 1991 | Japan . |
| 4-281287 | of 1992 | Japan . |
| 5-28771 | of 1993 | Japan . |

*Primary Examiner*—Tan T. Nguyen
*Attorney, Agent, or Firm*—Lowe, Price, LeBlanc & Becker

[57] ABSTRACT

There are provided upper and lower data I/O terminal groups, each forming a unit for input/output of data. When an early write detecting circuit included in a clock generating circuit detects designation of an early write mode and one of the groups is designated for writing, lower or upper input buffers controlled by write control circuit takes in the data. Concurrently, in response to the detection of mode, lower or upper output buffer uses, for reading, the other group not taking in data for writing. In this mode, therefore, the write and read operations are executed simultaneously. Thereby, simultaneous operation of the write and read data is allowed, and a data processing speed is improved.

14 Claims, 18 Drawing Sheets

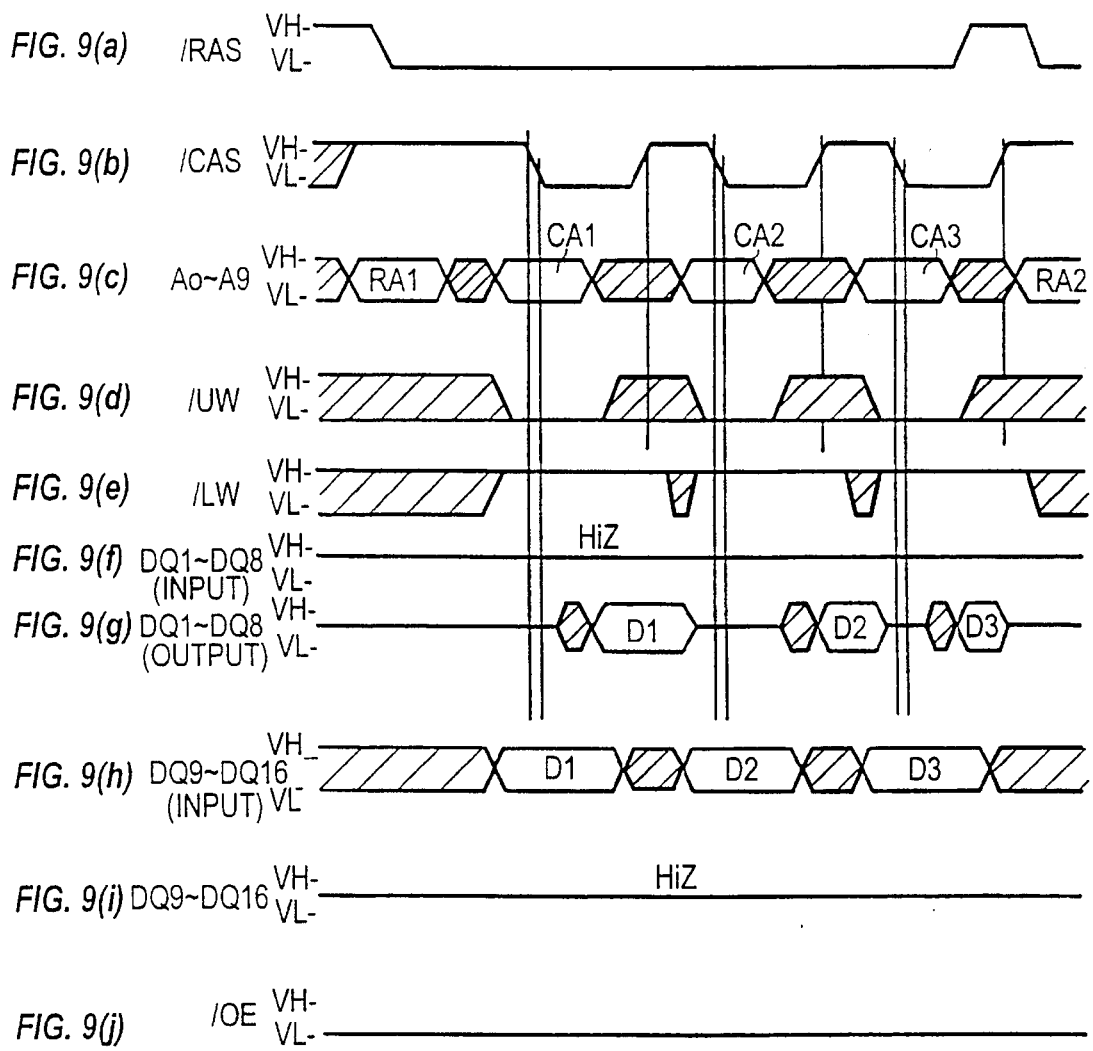

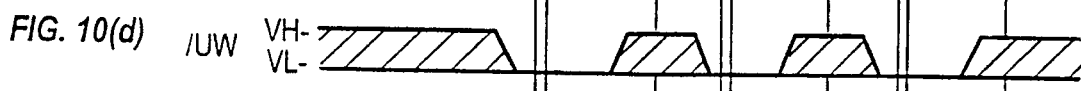
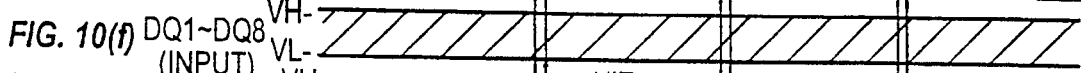
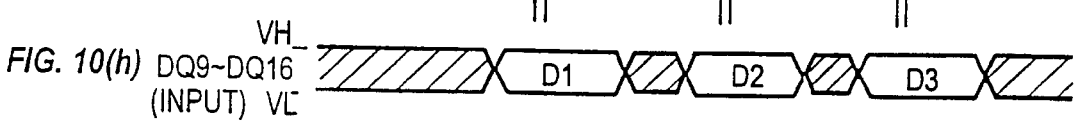

FIG. 11(a) /RAS 
FIG. 11(b) /CAS 
FIG. 11(c) A0~Aq 
FIG. 11(d) /UW (/LW) 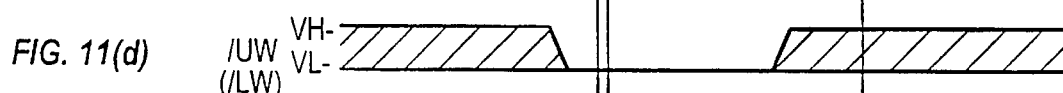
FIG. 11(e) /LW (/UW) 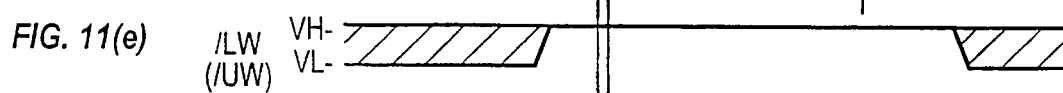
FIG. 11(f) DQ1~DQ8 (INPUT) 
FIG. 11(g) DQ1~DQ8 (OUTPUT) 
FIG. 11(h) DQ9~DQ16 (INPUT) 
FIG. 11(i) DQ9~DQ16 (OUTPUT) 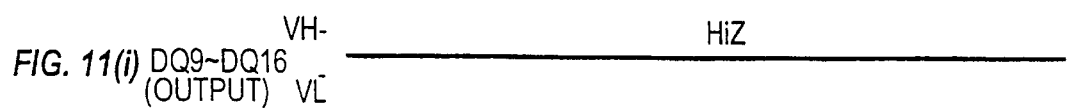
FIG. 11(j) /OE 

FIG. 12 (a) /RAS
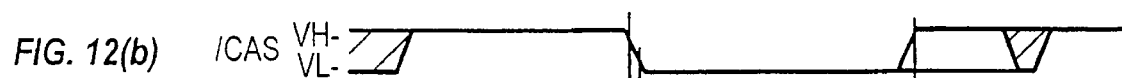
FIG. 12(b) /CAS
FIG. 12(c) A0~A9
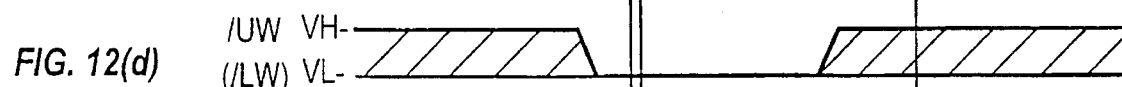
FIG. 12(d) /UW (/LW)
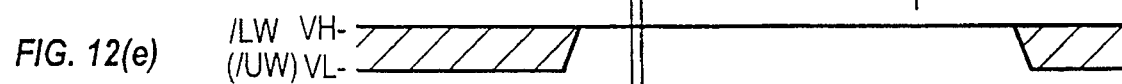
FIG. 12(e) /LW (/UW)
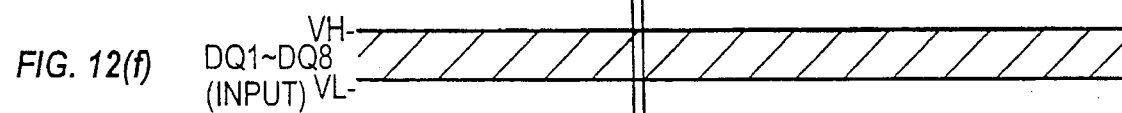
FIG. 12(f) DQ1~DQ8 (INPUT)
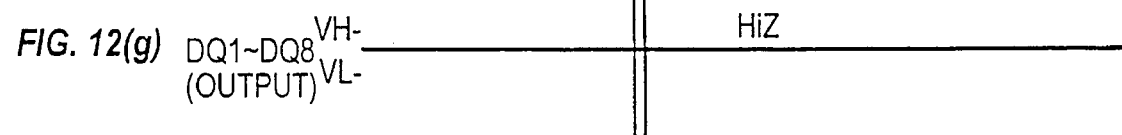
FIG. 12(g) DQ1~DQ8 (OUTPUT)
FIG. 12(h) DQ9~DQ16 (INPUT)
FIG. 12(i) DQ9~DQ16 (OUTPUT)
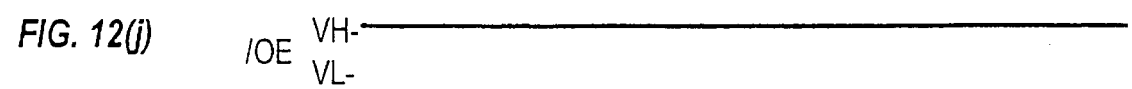
FIG. 12(j) /OE

*PRIOR ART*
FIG. 17(a) /RAS 
FIG. 17(b) /CAS 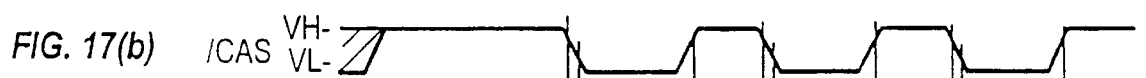
FIG. 17(c) Ao~A9 
FIG. 17(d) /UW 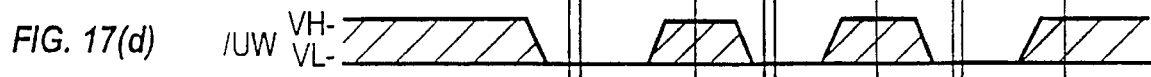
FIG. 17(e) /LW 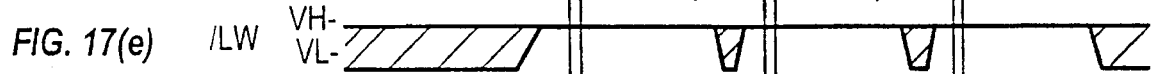
FIG. 17(f) DQ1~DQ8 (INPUT)
FIG. 17(g) DQ1~DQ8 (OUTPUT) 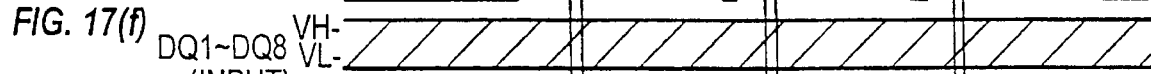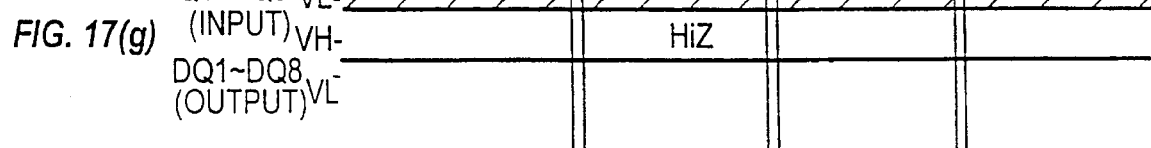
FIG. 17(h) DQ9~DQ16 (INPUT) 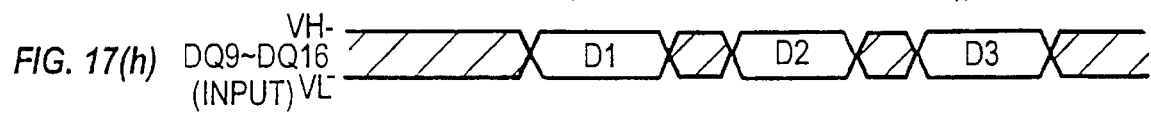
FIG. 17(i) DQ9~DQ16 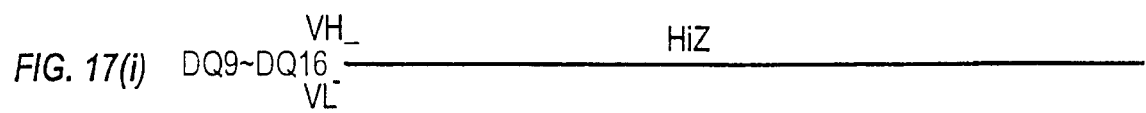
FIG. 17(j) /OE 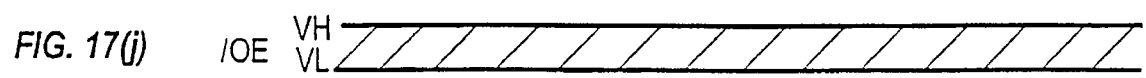

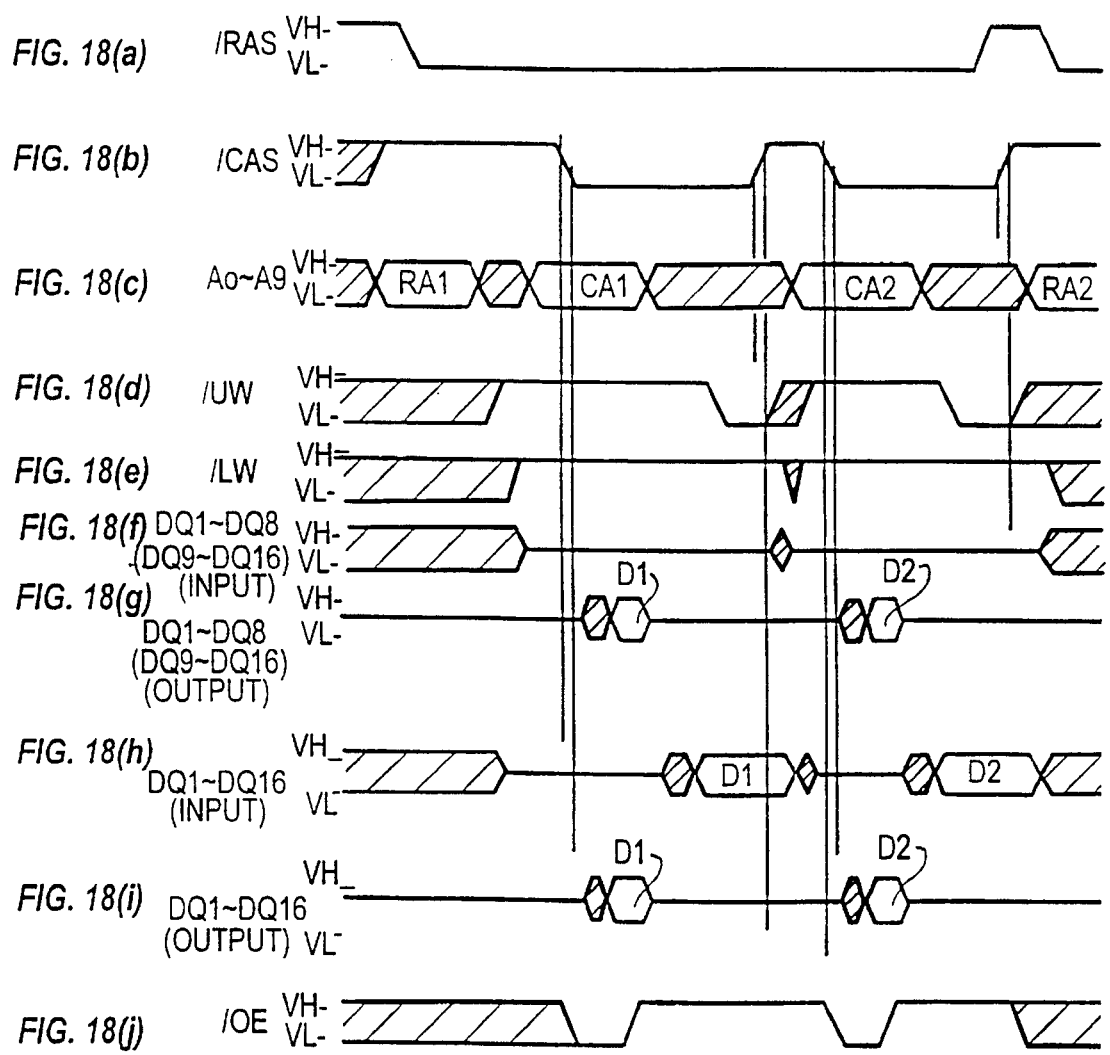

SEMICONDUCTOR MEMORY DEVICE HAVING A PLURALITY OF I/O TERMINAL GROUPS

BACKGROUND OF THE INVENTION

1. Field of the Invention

The present invention relates to a semiconductor memory device, and in particular to a semiconductor memory device having a plurality of I/O terminal groups.

2. Description of the Background Art

Such a conventional dynamic random access memory, which is a kind of semiconductor memory device and will also be referred to as a "DRAM", has been known that I/O terminal groups are divided into a plurality of groups, and data is input/output via these plurality of I/O terminal groups.

FIG. 13 is a block diagram showing a whole structure of a conventional DRAM.

Referring to FIG. 13, a DRAM 103 includes a memory cell array 1, a sense-refresh amplifier and I/O control circuit 11, a row decoder 12, a column decoder 13, an address buffer 14, a clock generating circuit 20, a write control circuit 3, a lower input buffer 4, an upper input buffer 5, an lower output buffer 600, an upper output buffer 700, an address input terminal group 80, a lower I/O terminal group 81, an upper I/O terminal group 82, signal input terminals 83–87, a power supply terminal 88 and a ground terminal 89.

DRAM 103 operates by receiving a power supply potential Vcc from power supply terminal 88 and receiving a ground potential Vss from ground terminal 89. Memory cell array 1 has a plurality of dynamic memory cells (not shown) arranged in rows and columns, and operates to accumulate storage information at the respective memory cells. Address input terminal group 80 has a plurality of address input terminals.

Address buffer 14 externally receives address signals A0–A9 via address input terminal group 80. Address buffer 14 sends received address signals A0–A9 to row decoder 12 as internal address signals, and also sends received address signals A0–A7 to column decoder 4 as internal address signals.

Row decoder 12 is responsive to the applied address signal to designating a row in memory cell array 1. For this designation, a word line (not shown) is selected. Column decoder 13 is responsive to the applied address signal to designate a column in memory cell array 1. For this designation, a bit line pair (not shown) is selected.

In a read operation, data read from the selected memory cell in memory cell array 1 is transmitted to lower data I/O terminal group 81 via sense-refresh amplifier and I/O control circuit 11 and lower output buffer 600. Data read from the memory cell is transmitted to upper data I/O terminal group 82 via sense-refresh amplifier and I/O control circuit 11 and upper output buffer 700. Data DQ1–DQ16 transmitted in this manner are externally output.

In a write operation, data DQ1–DQ8 input via lower data I/O terminal group 81 are written in the selected memory cells in memory cell array 1 via lower input buffer 4 and sense-refresh amplifier and I/O control circuit 11.

Data DQ9–DQ16 input via upper data I/O terminal group 82 are written in the selected memory cells in memory cell array 1 via upper input buffer 5 and sense-refresh amplifier and I/O control circuit 11.

DRAM 103 is controlled in response to a row address strobe signal /RAS externally applied via signal input terminal 83, a column address strobe signal /CAS externally applied via signal input terminal 84, a lower write designating signal /LW externally applied via signal input terminal 85, an upper write designating signal /UW externally applied via signal input terminal 86 and an output enable signal /OE externally applied via signal input terminal 87. In the description, the symbol "/" indicates an inverted signal.

The clock generating circuit 20 receives signals /RAS, /CAS, /LW, /UW and /OE, and generate signals such as a clock signal in response to these signals. The signals generated from clock generating circuit 20 are applied to sense-refresh amplifier and I/O control circuit 11, row decoder 12, column decoder 13, address buffer 14, write control circuit 3, lower output buffer 600 and upper output buffer 700, respectively.

Sense-refresh amplifier and I/O control circuit 11, row decoder 12, column decoder 13 and address buffer 14 are responsive to the signals sent from clock generating circuit 20.

Write control circuit 3 receives signals /LW and /UW as well as signals sent from clock generating circuit 20, lower output buffer 600 and upper output buffer 700. In response to these received signals, write control circuit 3 outputs the signals for controlling lower input buffer 4 and upper input buffer 5.

Each of lower input buffer 4 and upper input buffer 5 is responsive to the signal sent from write control circuit 3. Each of lower and upper output buffers 600 and 700 is responsive to signal /OE and the signals sent from clock generating circuit 20.

An example of an operation mode of the DRAM thus constructed will be described below. First, description will be given on an early write mode. The early write mode is an operation mode in which signal /LW or /UW for designating or instructing the write operation is raised to start the write operation after falling of signal /RAS for externally taking in the row address signal and before falling of signal /CAS for taking in the column address signal.

In order to execute the early write mode, DRAM 103 must has circuits shown in FIGS. 14 and 16 which will be described below.

FIG. 14 is a circuit diagram showing a conventional early write detecting circuit for executing the early write mode.

Referring to FIG. 14, an early write detecting circuit 2000 is included in clock generating circuit 20 in FIG. 13. Early write detecting circuit 2000 includes inverters 231–233, 235–238 and 243–245, NOR gates 239–241 and NAND gates 234 and 242.

Signal /CAS is applied to one of input terminals of NAND gate 234 through inverters 231, 232 and 233. A signal /CAS0 is output from a node between the output terminal of inverter 232 and the input terminal of inverter 233. Signal /CAS0 is an internal signal of signal /CAS.

Signal /RAS is applied to one of input terminals of each of NOR gates 239 and 240 through inverters 235, 236, 237 and 238. A signal /RASC is output from a node near the output terminal of inverter 238. Signal /RASC is an internal signal of signal /RAS.

Signal /LW is applied to the other input terminal of NOR gate 239. Signal /UW is applied to the other input terminal of NOR gate 240. In NOR gate 241, the output signal of NOR gate 239 is applied to one of its input terminals, and the output signal of NOR gate 240 is applied to the other input terminal. The output signal of NOR gate 241 is applied to one of input terminals of NAND gate 242.

The output signal of NAND gate 242 is applied to the other input terminal of NAND gate 234. The output signal of NAND gate 234 is applied to the other input terminal of NAND gate 242 and is also output as an early write detecting signal EW through inverters 243, 244 and 245.

Early write detecting circuit 2000 thus constructed operates in the following manner. When signal /RAS is at the H-level, both the output signals of NOR gates 239 and 240 attain the L-level. In this case, therefore, the output signal of NOR gate 241 attains the H-level.

When signal /RAS is at the L-level, the output signal of NOR gate 239 attains the level equal to the inverted level of signal /LW, and the output signal of NOR gate 240 attains the level equal to the inverted level of signal /UW.

When signal /RAS is at the L-level and one of signals /UW and /LW attains the L-level, the output signal of NOR gate 241 attains the L-level. In this case, the output signal of NAND gate 242 attains the H-level. In this state, therefore, the output signal of inverter 233 attains the H-level when signal /CAS lowers from the H-level to the L-level.

In this case, therefore, the output signal of NAND gate 234 lowers from the H-level to the L-level, and early write detecting signal EW rises from the L-level to the H-level in response to this lowering. The early write mode is set when signal EW attains the H-level as described above.

FIG. 15 is a circuit diagram of conventional lower and upper output buffers 600 and 700 for executing the early write mode.

Referring to FIG. 15, lower and upper buffers 600 and 700 correspond to those shown in FIG. 13. Upper output buffer 600 includes inverters 601–603, 62, 64 and 66, a 4-input NAND gate 606, 2-input NAND gates 63 and 65, and N-channel MOS transistors 67 and 68.

Upper output buffer 700 includes a 4-input NAND gate 607, inverters 72, 74 and 76, 2-input NAND gates 73 and 75, and N-channel MOS transistors 77 and 78. An inverter 608 for inverting signal /CAS0 may be included in any one of lower and upper output buffers 600 and 700.

In lower output buffer 600, signal /OE is applied to one of input terminals of NAND gate 606 through inverters 601–603. NAND gate 606 also receives on corresponding input terminals a signal DOTE, signal /CAS0 applied through inverter 608 and inverted signal /EW of signal EW. Signal DOTE indicates the fact that DRAM 103 is ready to start reading of data, and is supplied from clock generating circuit 20.

The output signal of NAND gate 606 is applied to one of input terminals of each of NAND gates 63 and 65 through inverter 62. The inverter 62 outputs a signal OEML indicative of the fact that lower output buffer 600 is reading data.

NAND gate 63 receives read data RDF output from sense-refresh amplifier and I/O control circuit 11 (see FIG. 13) on the other input terminal. NAND gate 65 receives read data /RDF at the inverted level of read data RDF on the other input terminal.

A power supply node N1 receives the power supply potential Vcc. A ground node N2 receives ground potential vss. Transistors 67 and 68 are connected in series between power supply node N1 and ground node N2. A node between transistors 67 and 68 is connected to one of terminals of data I/O terminal group 81.

The output signal of NAND gate 63 is applied to a gate electrode of transistor 67 through inverter 64. The output signal of NAND gate 65 is applied to a gate electrode of transistor 68 via inverter 66.

The upper output buffer 700 has a structure similar to that of lower output buffer 600. In upper output buffer 700, NAND gate 607 receives the same signal as NAND gate 606 in lower output buffer 600.

The output signal of NAND gate 607 is applied to one of input terminals of each of NAND gates 73 and 75. The output signal of inverter 72 is output as a signal OEMH indicative of that fact that upper output buffer 700 is reading data.

NAND gate 73 receives read data RDF on the other input terminal. NAND gate 75 receives read data /RDF on the other input terminal. Transistors 77 and 78 are connected in series between power supply node N1 and ground node N2. A node between transistors 77 and 78 is connected to one terminal in upper data I/O terminal group 82.

The output signal of NAND gate 73 is applied to a gate electrode of transistor 77 through inverter 74. The output signal of NAND gate 75 is applied to a gate electrode of transistor 78 through inverter 76.

Lower and upper output buffers 600 and 700 thus constructed operate as described below. Since these output buffers have the same structure, only lower output buffer 600 will be described below.

When both signals /EW and DOTE are at the H-level, and both signals /CAS and /OE are at the L-level, all the input signals in NAND gate 600 are at the H-level. Therefore, the output signal of NAND gate 600 is at the L-level.

In this state, DRAM 103 is ready to start reading of internal data, the early write mode is not detected, and both signals /CAS and /OE are at the L-level. In this case, signal OEML is at the H-level, and, in response to this, read data RDF is transmitted to data I/O terminal group 81.

During this transmission, if read data RDF is at the H-level, transistor 67 is on and transistor 68 is off, whereby data at the H-level is externally output. Meanwhile, if read data RDF is at the L-level, transistor 67 is off, and transistor 68 is on, so that data at the L-level is externally output.

When signal /EW among the signals sent to NAND gate 606 is at the L-level, that is; when the early write mode is detected, the output signal of NAND gate 606 is at the H-level. In this case, signal OEML is at the L-level, and read data RDF is not transmitted to data I/O terminal group 81. In this case, both transistors 67 and 68 are off, so that data sent from lower data I/O terminal group 81 is in the high-impedance state.

FIG. 16 is a circuit diagram of a conventional write control circuit for executing the early write mode.

Referring to FIG. 16, write control circuit 3 corresponds to that shown in FIG. 13. Write control circuit 3 includes NOR gates 331, 333, 335 and 346, inverters 332, 334, 336, 337, 339, 340, 343–345, 347, 348, 350 and 351, NAND gates 338, 342 and 349, and N-channel MOS transistors 341 and 352.

NOR gate 331 receives signal OEML on one of its input terminals, and receives signal OEMH on the other input terminal. The output signal of NOR gate 331 is output as a signal OOEMD for internally controlling the output of DRAM 103, and is also applied to one of input terminals of NOR gate 333. Signal /RASC is applied to the other input terminal of NOR gate 333.

The output signal of NOR gate 333 is applied to one of input terminals of NOR gate 335 through inverter 334, and is also applied to one of input terminals of NOR gate 346 through inverter 345. Signal /LW is applied to the other input terminal of NOR gate 335. Signal /UW is applied to the other input terminal of NOR gate 346.

The output signal of NOR gate 335 is applied to one of input terminals of NAND gate 338 via inverters 336 and 337. The output signal of NOR gate 335 is also applied to one of input terminals of NAND gate 342 through inverter 336.

Transistor 341 is connected between ground node N2 and a node formed between the output terminal of NOR gate 335 and the input terminal of inverter 336. Transistor 341 receives on its gate electrode the output signal of inverter 336.

The output signal of NOR gate 346 is applied to one of input terminals of NAND gate 349 through inverters 347 and 348. The output signal of NOR gate 346 is also applied to the other input terminal of NAND gate 342 through inverter 347.

Transistor 352 is connected between ground node N2 and a node formed between the output terminal of NOR gate 346 and the input terminal of inverter 347. Transistor 352 receives on its gate electrode the output signal of inverter 347.

The output signal of NAND gate 342 is applied to the other input terminal of each of NAND gates 338 and 349 through inverters 343 and 344. The output signal of NAND gate 338 is output through inverters 339 and 340 as a lower write enable signal /WEL. The output signal of NAND gate 349 is output through inverters 350 and 351 as an upper write enable signal /WEU.

Lower write enable signal /WEL is applied to write input buffer 4 (see FIG. 13), and upper write enable signal /WEU is applied to upper input buffer 5 (see FIG. 13). Each of these write enable signals /WEL and /WEU is operable to control the corresponding output buffer to attain the state for the write operation, when it attains the L-level.

The write control circuit 3 operates in the following manner. When at least one of lower and upper output buffers 600 and 700 is performing the read operation, and hence at least one of signals OEML and OEMH is at the H-level, or when signal /RAS is at the H-level indicative of the standby state, and hence signal /RASC is at the H-level indicative of the standby state, the output signal of NOR gate 333 is at the L-level.

In this case, one of the input signals of each of NOR gates 335 and 346 attains the H-level. Therefore, each of the output signals of NOR gates 335 and 346 attains the L-level.

In response to this, one of input signals of each of NAND gates 338 and 349 attains the L-level. Therefore, both signals /WEL and /WEU attain the H-level. In this case, therefore, the write operation using lower and upper input buffers 4 and 5 in FIG. 13 is not performed.

Meanwhile, when both signals OEML and OEMH are at the L-level owing to the fact that lower and upper output buffers 600 and 700 are not in the read operation state, and signal /RASC is at the L-level owing to the fact that signal /RAS is at the L-level, the output signal of NOR gate 333 is at the H-level.

In this case, one of the input signals of NOR gate 335 is at the L-level. Therefore, the output signal of NOR gate 335 attains the level equal to the inverted level of signal /LW. Likewise, one of the input signals of NOR gate 346 is at the L-level, so that the output signal of NOR gate 346 attains the level equal to the inverted level of signal /UW.

In this case, therefore, the output signal of one of the NOR gates corresponding to the one between signals /LW and /UW which attains the L-level attains the H-level. When the output signal of NOR gate 335 attains the H-level, both the two input signals of NAND gate 338 attain the H-level.

In this case, therefore, signal /WEL attains the L-level in response to the output signal at the L-level output from NAND gate 338. In this case, signal /WEU attains the H-level. Therefore, only lower input buffer 4 in FIG. 13 performs the write operation.

Meanwhile, when the output signal of NOR gate 346 attains the H-level, both the two input signals of NAND gate 349 attain the H-level. Therefore, the output signal of NAND gate 349 attains the L-level, and the signal /WEU attains the L-level in response to this. In this case, signal /WEL attain the H-level. Therefore, only upper input buffer 5 performs the write operation.

Now, description will be given on the operation in the early write mode of the DRAM shown in FIGS. 13 to 16. FIG. 17 is a timing chart showing the operation in the early write mode of DRAM 103 shown in FIGS. 13 to 16. Particularly, FIG. 17 shows the operation in the case that the early write mode is executed in accordance with a fast page mode byte control cycle.

In FIG. 17, there are shown signals /RAS and /CAS, address signals A0–A9, signals /UW and /LW, input data DQ1–DQ8 corresponding to lower input buffer 4, output data DQ1–DQ8 corresponding to lower output buffer 600, input data DQ9–DQ16 corresponding to upper input buffer 5, output data DQ9–DQ16 corresponding to upper output buffer 700 and signal /OE.

In the early write mode, as shown in FIG. 17, signal (e.g., signal /UW) is lowered from the H-level to the L-level after falling of signal /RAS for taking in a row address RA1 and before falling of signal /CAS for taking in a column address CA1. At this time, signal /LW is maintained at the H-level. In the case above, signal /LW may be lowered instead of signal /UW.

In response to these signals, early write detecting circuit 2000 shown in FIG. 14 detects the fact that the early write mode is designated. Thereby, signal EW output from early write detecting circuit 2000 attains the H-level. Thereafter, signal /CAS falls in accordance with a predetermined cycle for taking in column addresses CA2 and CA3.

In response to the H-level of signal /EW, lower and upper output buffers 600 and 700 shown in FIG. 15 set corresponding lower and upper output data DQ1–DQ8 and DQ9–DQ16 to high-impedance state HiZ, respectively.

In this case, both signals OEML and OEMH attain the L-level. Therefore, in response to the fact that signal /UW attains the L-level, signal /WEU output from write control circuit 3 shown in FIG. 16 attains the L-level.

Thereby, upper I/O terminal group 82 is used for writing data. Therefore, writing is performed by inputting effective data D1–D3 into upper input data DQ9–DQ16 corresponding to upper input buffer 5. Meanwhile, lower I/O terminal group 81 is not used for writing/reading data.

In DRAM 103 which can operate in the early write mode, one of lower and upper I/O terminal groups 81 and 82 can be used for the write operation while maintaining the other in the standby state.

In the conventional early write mode, however, only the write operation can be executed within one cycle of signal /RAS. In the prior art, however, such a read modified write mode has been used that the read operation and the write operation can be executed within one cycle of signal /RAS.

The read modified write mode will be described below. The following description will recite an example of executing the read modified write mode in DRAM 103 shown in FIG. 13.

FIG. 18 is a timing chart showing the operation in the read modified write mode of DRAM 103. In FIG. 18, signals shown therein are similar to those in FIG. 17, but I/O data DQ1–DQ16 each are shown as only upper or lower data or combination of upper and lower data.

Referring to FIGS. 13 and 18, signal /RAS is lowered to the L-level while signal /CAS is at the H-level. In response to this, clock generating circuit 20 applied a signal, which is used for internally taking in address signals A0–A9 as row address RA1 from address input terminal group 80, to address buffer 14.

Based on row address RA1 thus taken, row decoder 12 selects a word line in memory cell array 1. Thereby, data in the memory cells at the row corresponding to the selected word line is transmitted onto the bit line pair. Data transmitted onto the bit line pair is amplified by sense-refresh amplifier and I/O control circuit 11.

Then, signal /CAS is lowered to the L-level. During this, both signals /UW and /LW are at the H-level. In response to the change of signal /CAS, clock generating circuit 20 applied a signal, which is used for internally taking in address signals A0–A9 as column address CA1 from address input terminal group 80, to address buffer 14.

In this state, signals /UW and /LW are at the H-level. Therefore, lower and upper data I/O terminal groups 81 and 82 both operate in the read mode.

Thereby, based on the taken column address CA1, column decoder 13 transmits the data, which has been read onto the bit line pair as described before, to the lower and upper output buffers 600 and 700 through sense-refresh amplifier and I/O control circuit 11.

Then, signal/OE is lowered to the L-level. In response to this, data D1 is transmitted from lower and upper output buffers 600 and 700 to lower and upper data I/O terminal groups 81 and 82, respectively. The data thus transmitted is externally output.

Thereafter, signal /OE is raised to the H-level. Thereby, external output of data is completed. Subsequently, signal /UW (or /LW) is lowered to the L-level. By lowering only signal /UW to the L-level, upper input buffer 5 takes in upper data DQ9–DQ16 among data DQ1–DQ16 received by lower and upper I/O terminal groups 81 and 82.

Data thus taken is transmitted to the selected memory cells through sense-refresh amplifier and I/O control circuit 11, and is written into them.

According to the read modified write mode, the read operation and the write operation can be continuously executed for the selected memory cell within one cycle of signal /RAS. In the prior art, the operation in the read modified write mode must be controlled to use lower data I/O terminal group 81 for the read operation and use upper data I/O terminal group 82 for the write operation.

However, when executing the read operation and the write operation using the read modified write mode as described above, these operations cannot be performed simultaneously. Therefore, the read modified write mode is not suitable to data processing in which a fast access such as a fast page mode is performed.

SUMMARY OF THE INVENTION

An object of the invention is to provide a semiconductor memory device which allows fast data processing by allowing simultaneous execution of write and read operations.

Another object of the invention is to provide a semiconductor memory device which can provide a state allowing simultaneous execution of write and read operations, and also allows selective execution of the read operation during the above state.

In a semiconductor memory device according to an aspect of the invention, an early write mode activating a write operation can be executed by changing a write designating signal for designating the write operation after change of a row address strobe signal for taking in a row address and before change of a column address strobe signal for taking in a column address. The semiconductor memory device includes a plurality of data I/O terminal groups, a plurality of write designating signal input terminals, an early write detecting circuit, a plurality of write circuits and a plurality of read circuits.

The plurality of data I/O terminal groups are divided into a plurality of groups each forming a unit for performing input and output of data. The plurality of write designating signal input terminals receive a plurality of write designating signals generated correspondingly to the plurality of data I/O terminal groups for selectively designating the data I/O terminal group used for writing the data, respectively.

The early write detecting circuit receives the row address strobe signal, the column address strobe signal and the plurality of write designating signals, and is responsive to the received signals by operating for each of the data I/O terminal groups to detect designation of the early write mode using each of the data I/O terminal groups.

The plurality of write circuits are provided correspondingly to the plurality of data I/O terminal groups, respectively, and each receive the write designation signal for the corresponding data I/O terminal group to perform control for using the corresponding data I/O terminal group for writing the data when the received write designation signal designates the corresponding data I/O terminal group.

The plurality of read circuits are provided correspondingly to the plurality of data I/O terminal groups, respectively, and each perform control for using the corresponding data I/O terminal group for reading the data when the early write detecting circuit does not detect the designation of the early write mode for the corresponding data I/O terminal group.

In operation, each of the plurality of write circuits performs the control for using the corresponding data I/O terminal group for writing the data when the write designation signal for the corresponding data I/O terminal group designates the corresponding data I/O terminal group.

Further, the early write detecting circuit detects the early write mode in accordance with each write designating signal. Thus, the early write mode is detected correspondingly to each data I/O terminal group.

Each of the plurality of read circuits performs the control for using the corresponding data I/O terminal group for reading the data when designation of the early write mode for the corresponding data I/O terminal group is not detected.

Therefore, in the early write mode, the plurality of data I/O terminal groups can be divided into a group for writing data and a group for reading data, which are operated simultaneously. Therefore, a data processing speed can be increased.

In a semiconductor memory device according to another aspect of the invention, an early write mode activating a write operation can be executed by changing a write designating signal for designating the write operation after change of a row address strobe signal for taking in a row address and before change of a column address strobe signal for taking in a column address. The semiconductor memory device includes a plurality of data I/O terminal groups, a plurality of write designating signal input terminals, an output enable signal input terminal, an early write detecting circuit, a plurality of write circuits and a plurality of read circuits.

The plurality of data I/O terminal groups are divided into a plurality of groups each forming a unit for performing input and output of data. The plurality of write designating signal input terminals receive a plurality of write designating signals generated correspondingly to the plurality of data I/O terminal groups for selectively designating the data I/O terminal group used for writing the data, respectively.

The output enable signal input terminal receives an output enable signal enabling external output of data.

The early write detecting circuit receives the row address strobe signal, the column address strobe signal and the plurality of write designating signals, and is responsive to the received signals by operating for each of the data I/O terminal groups to detect designation of the early write mode using each of the data I/O terminal groups.

The plurality of write circuits are provided correspondingly to the plurality of data I/O terminal groups, respectively, and each receive the write designation signal for the corresponding data I/O terminal group to perform control for using the corresponding data I/O terminal group for writing the data when the received write designation signal designates the corresponding data I/O terminal group.

The plurality of read circuits are provided correspondingly to the plurality of data I/O terminal groups, respectively, and each perform control for using the corresponding data I/O terminal group for reading the data when the early write detecting circuit does not detect the designation of the early write mode for the corresponding data I/O terminal group and the output enable signal enables the output of data.

In operation, each of the plurality of write circuits performs the control for using the corresponding data I/O terminal group for writing the data when the write designation signal for the corresponding data I/O terminal group designates the corresponding data I/O terminal group.

Further, the early write detecting circuit detects the early write mode in accordance with each write designating signal. Thus, the early write mode is detected correspondingly to data I/O terminal groups.

Each of the plurality of read circuits performs the control for using the corresponding data I/O terminal group for reading the data when designation of the early write mode for the corresponding data I/O terminal group is not detected and the output enable signal enables the output of data.

In the early write mode, therefore, the plurality of data I/O terminal groups are grouped into a group for data writing and a group of data reading, which can be operated simultaneously. However, the output enable signal determines whether the data I/O terminal group is to be used for data reading or not. Therefore, the group for data writing and the group for data reading are simultaneously operated in the early write mode only when data reading is required.

Accordingly, in addition to increasing of the data processing speed, the group for data writing and the group for data reading can be simultaneously operated in the early write mode only when data must be read.

The semiconductor memory devices according to the above aspects may have the following structures.

The early write detecting circuit may have a plurality of detecting circuits provided correspondingly to the plurality of data I/O terminal groups, respectively. The plurality of detecting means receive the row address strobe signal, the column address strobe signal and the corresponding write designating signals and are responsive to the received signals to detect designation of the early write mode for the corresponding data I/O terminal groups.

According to this structure, in which the early write detecting circuit have the plurality of detecting circuits corresponding to the plurality of data I/O terminal groups, respectively, the plurality of data I/O terminal groups can be divided into the group for data writing and the group for data reading to use them simultaneously in the early write mode.

Each of the plurality of write circuits may include a write control circuit and an input buffer circuit. The write control circuit receives the write designation signal for the corresponding data I/O terminal group, and outputs a write control signal for designating use of the corresponding I/O terminal group for the data writing when the received signal designates the corresponding data I/O terminal group.

The input buffer circuit receives the write control signal for the corresponding I/O terminal group, and receives the data sent from the corresponding I/O terminal group when the received signal designates the use of the corresponding I/O terminal group for the data writing.

According to the above structure, in which each of the plurality of write circuits includes the write control circuit and the input buffer circuit controlled by the write control circuit, the plurality of data I/O terminal groups can be divided into the group for data writing and the group for data reading to use them simultaneously in the early write mode.

Each of the plurality of read circuits may include an output buffer circuit receiving data to be read and applying the received data to the corresponding I/O terminal group.

According to this structure, in which each of the plurality of read circuits includes the output buffer circuit, the plurality of data I/O terminal groups can be divided into the group for data writing and the group for data reading to use them simultaneously in the early write mode.

The input row address strobe signal and the input column address strobe signal may define access in accordance with a cycle such as a normal mode cycle such that the column address strobe signal performs change of one cycle during a period of one cycle of change of the row address strobe signal.

According to the above structure, the plurality of data I/O terminal groups can be divided into the group for data writing and the group for data reading to use them simultaneously in the early write mode, when the access is performed in the normal mode cycle. Therefore, fast access in accordance with the normal mode cycle is allowed.

The input row address strobe signal and the input column address strobe signal may define access in accordance with a fast page mode cycle such that the column address strobe signal performs change of multiple cycles during a period of one cycle of change of the row address strobe signal.

According to the above structure, the plurality of data I/O terminal groups can be divided into the group for data writing and the group for data reading to use them simultaneously in the early write mode, when the access is performed in accordance with the fast page mode cycle. Therefore, fast access in accordance with the fast page mode cycle is allowed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9(a)–9(j) are timing charts showing operation when simultaneously performing a write operation and a read operation during the early write mode of the DRAM of the second embodiment;

FIGS. 10(a)–10(j) are timing charts showing operation when performing only a write operation during the early write mode of the DRAM of the second embodiment without executing a read operation;

FIGS. 11(a)–11(j) are timing charts showing operation when simultaneously performing a write operation and a read operation during execution of an early write mode of the DRAM of the second embodiment in accordance with a normal mode byte control cycle;

FIGS. 12(a)–12(j) are timing charts showing operation when performing only a write operation without performing a read operation during execution of an early write mode of the DRAM of the second embodiment in accordance with a normal mode byte control cycle;

FIGS. 17(a)–(j) is a timing chart showing operation during an early write mode of the DRAM shown in FIGS. 13 to 16; and FIGS. 18(a)–18(j) are timing charts showing operation during a read modified write mode of the conventional DRAM.

DESCRIPTION OF THE PREFERRED EMBODIMENTS

Embodiments of the invention will be described below with reference to the drawings.

First Embodiment

Description will now be given on a first embodiment. The first embodiment will be described below in connection with an example that writing of data and reading of data can be executed simultaneously in an early write mode.

Figure 1:
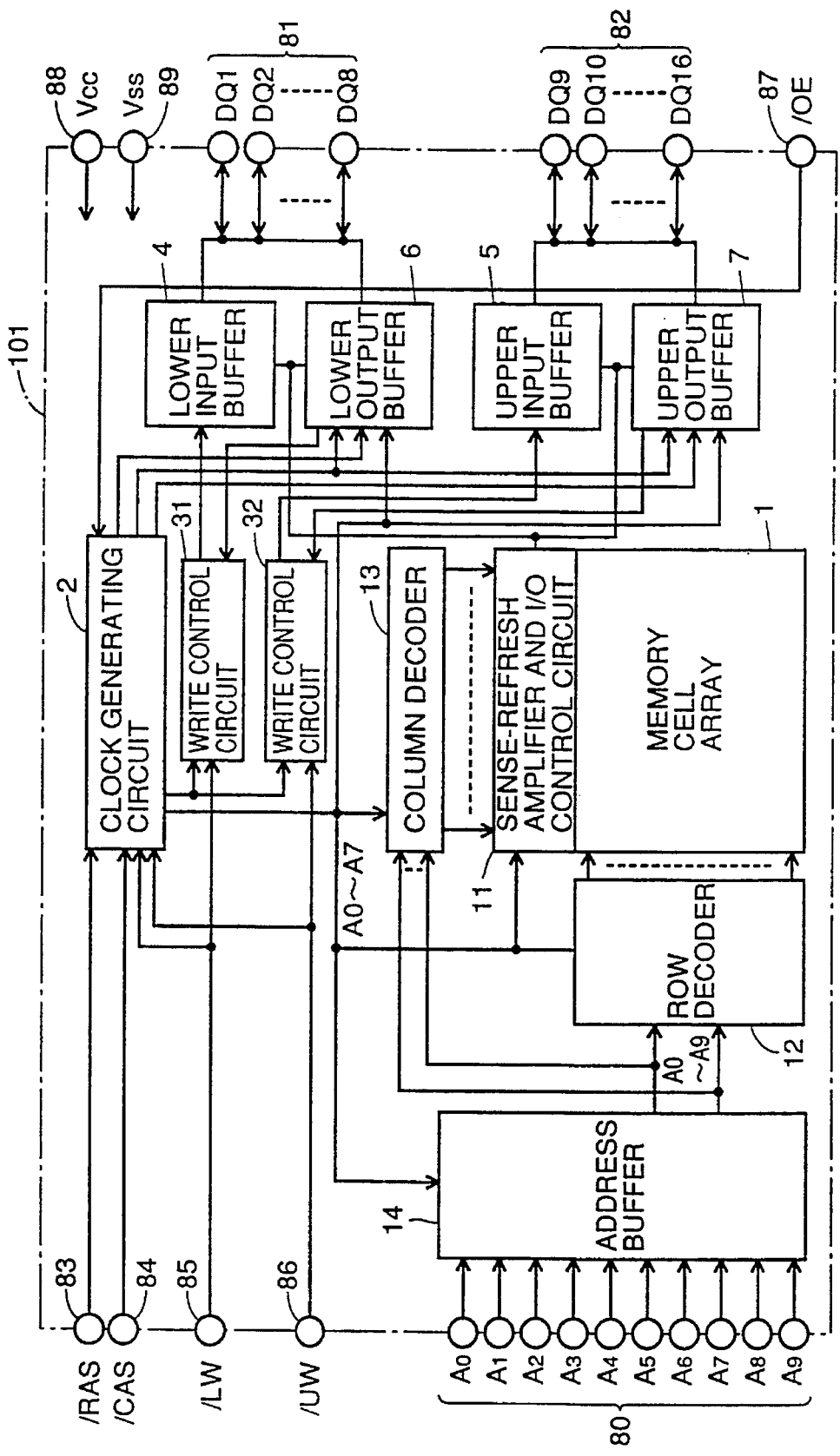
FIG. 1 is a block diagram showing a structure of a DRAM of a first embodiment.

FIG. 1 is a block diagram showing a whole structure of a DRAM of the first embodiment. In FIG. 1, portions similar to those in FIG. 13 bear the same reference numbers, and will not be described below.

Figure 13:
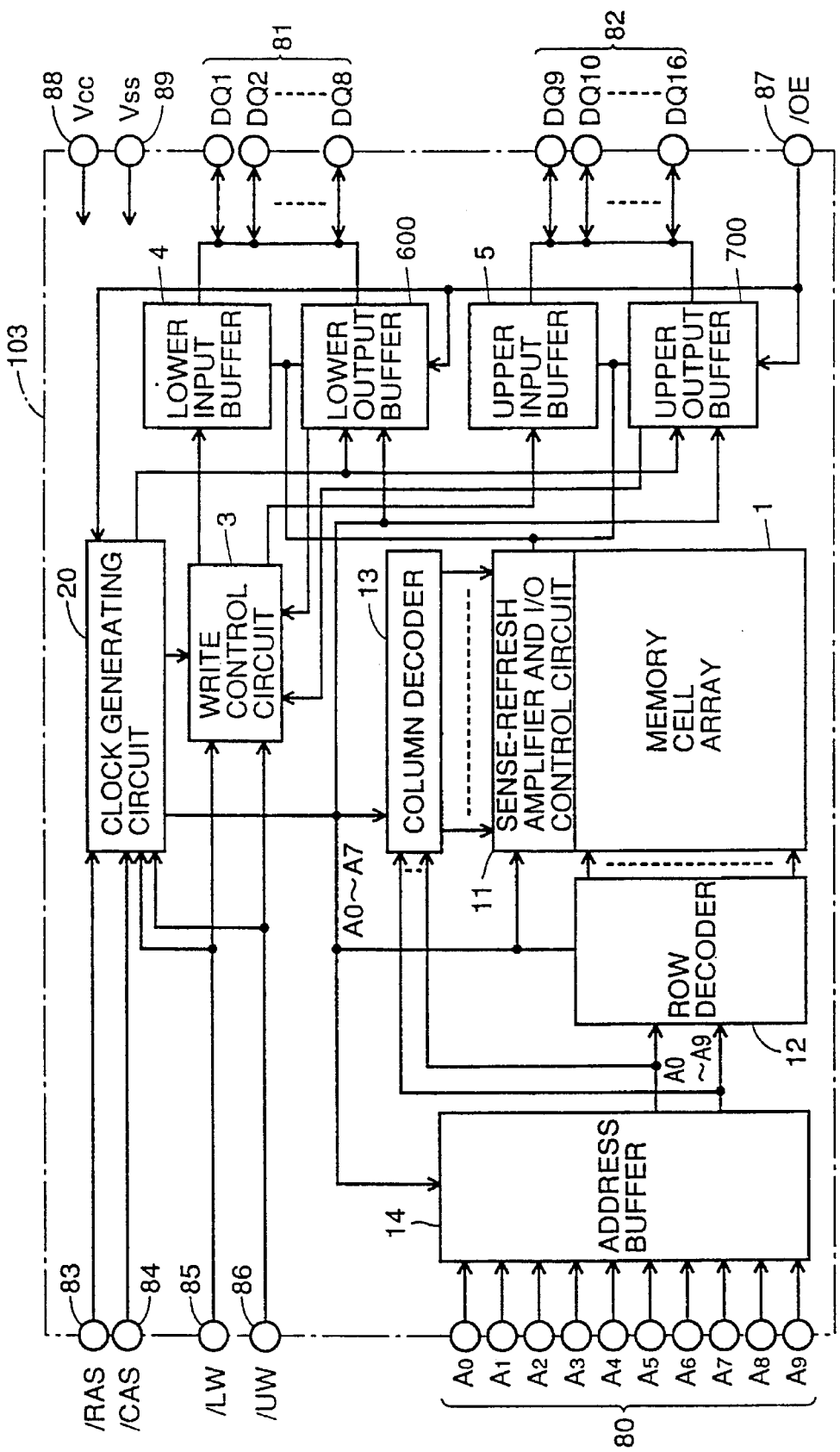
FIG. 13 is a block diagram showing a whole structure of a conventional DRAM.
Figure 14:
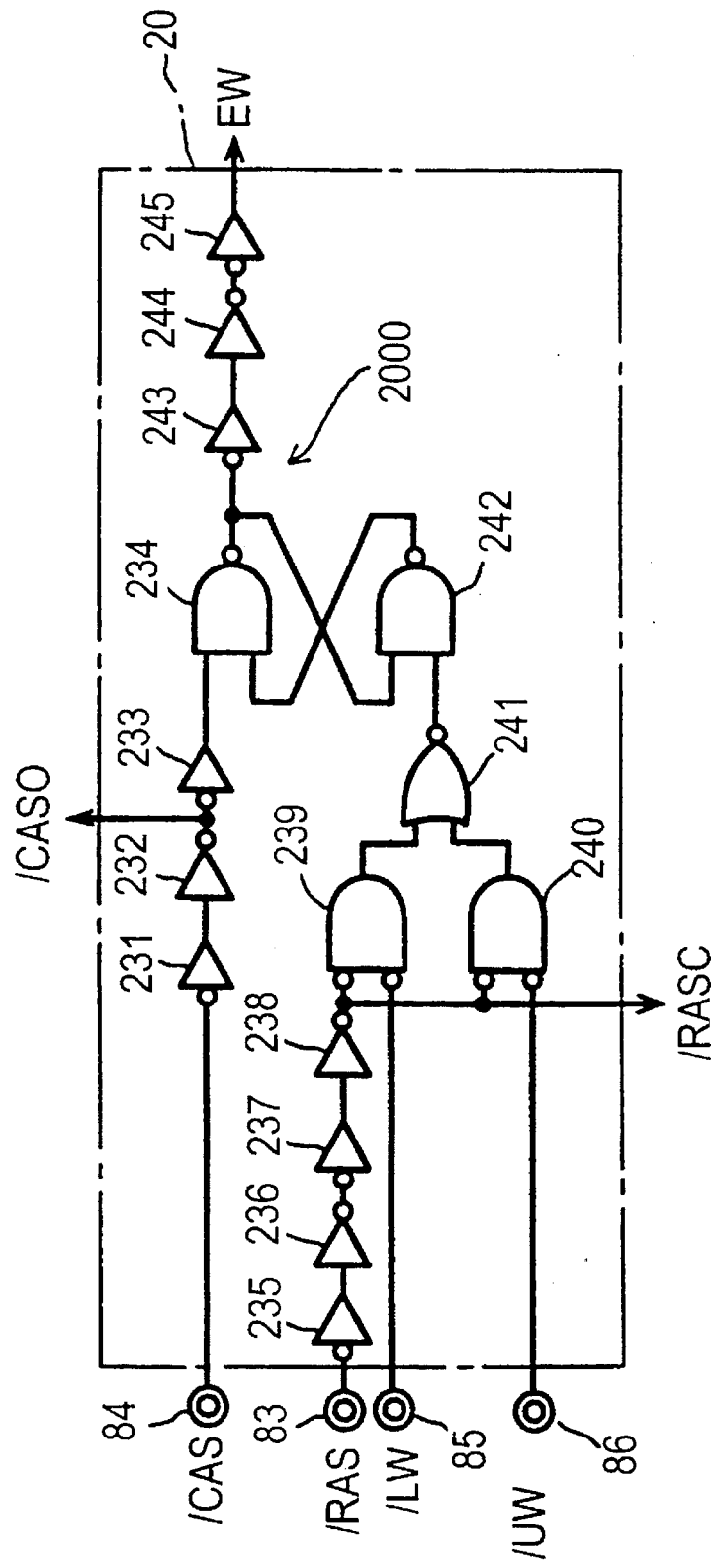
FIG. 14 is a circuit diagram of a conventional early write detecting circuit for executing an early write mode.

The DRAM in FIG. 1 differs from that in FIG. 13 in the following points. In FIG. 1, a clock generating circuit 2 includes an early write detecting circuit, to be described later, write control circuits 31 and 32, a lower output buffer 6 and an upper output buffer 7, all of which are different from those in FIG. 1. Further, signal lines in the DRAM in FIG. 1 are different from those in FIG. 13.

These differences will be individually described below.

Figure 2:
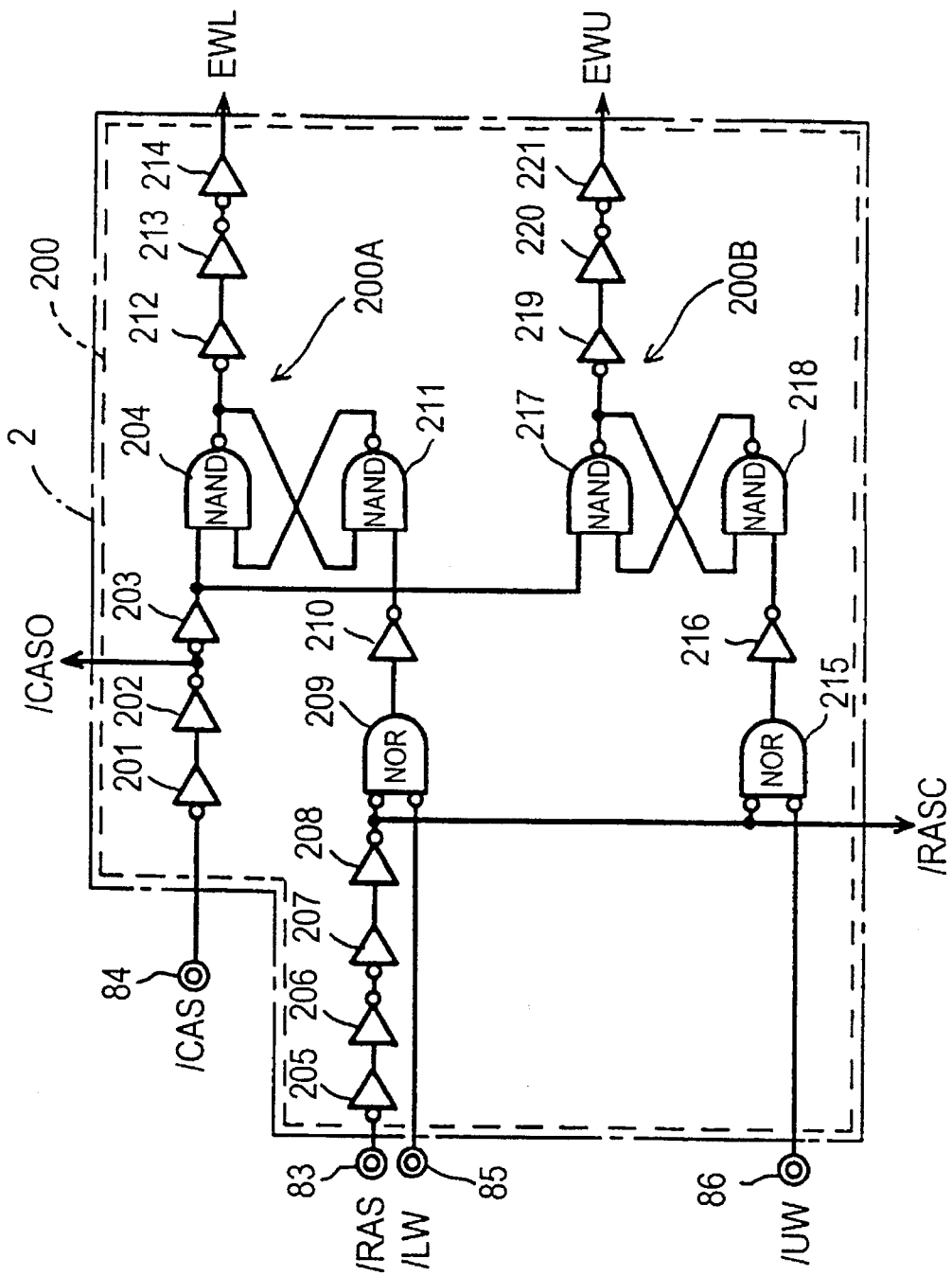
FIG. 2 is a circuit diagram of an early write detecting circuit included in a clock generating circuit in FIG. 1.

First, description will be given on the early write detecting circuit included in clock generating circuit 2 in FIG. 1. FIG. 2 is a circuit diagram of the early write detecting circuit included in the clock generating circuit 2 in FIG. 1.

Referring to FIG. 2, early write detecting circuit 200 includes inverters 201–203, 205–208, 210, 212–214, 216 and 219–221, NAND gates 204, 211, 217 and 218, and NOR gates 209 and 215.

Signal /CAS is applied to one of input terminals of each of NAND gates 204 and 217 through inverters 201–203. The output signal of inverter 202 is used as signal /CAS0. Signal /RAS is applied to one of input terminals of each of NOR gates 209 and 215 through inverters 205 and 208, and is also used as signal /RASC.

Signal /LW is applied to the other input terminal of NOR gate 209. The output signal of NOR gate 209 is applied to one of input terminals of NAND gate 211 through inverter 210.

The output signal of NAND gate 211 is applied to the other input terminal of NAND gate 204. The output signal of NAND gate 204 is applied to the other input terminal of NAND gate 211, and is also output as a lower early write detecting signal EWL through inverters 212–214.

Signal /UW is applied to the other input terminal of NOR gate 215. The output signal of NOR gate 215 is applied to one of input terminals of NAND gate 218 through inverter 216.

The output signal of NAND gate 218 is applied to the other input terminal of NAND gate 217. The output signal of NAND gate 217 is applied to the other input terminal of NAND gate 218, and is also output as an upper early write detecting signal EWU through inverters 219–221.

Signal EWL indicates a result of detection of the fact that the early write mode which uses data I/O terminal group 81 for the writing is designated in connection with signal /LW. Signal EWU indicates a result of detection of the fact that the early write mode which uses upper data I/O terminal group 82 for the writing is designated in connection with signal/UW. Each of signals EWL and EWU attains the H-level when the corresponding early write mode is detected.

Owing to the above structure, it can be understood that early write detecting circuit 200 is formed of a detecting circuit 200A generating signal EWL and a detecting circuit 200B generating signal EWU.

Then, the operation of early write detecting circuit 200 will be described below. When signal/RAS is at the L-level, the output signal of NOR gate 209 is at the level equal to the inverted level of signal/LW, and the output signal of NOR gate 215 is at the level equal to the inverted level of signal /UW.

In this case, when signal/LW attains the L-level, the output signal of inverter 210 attains the L-level. In response to this, the output signal of NAND gate 211 attains the H-level. When signal /CAS subsequently attains the L-level, the output signal of inverter 203 attain the H-level, and the output signal of NAND gate 204 attains the L-level in response to this. Thereby, signal EWL attains the H-level, so that the early write mode related to signal /LW is detected.

Meanwhile, when signal /UW attains the L-level while signal /RAS is at the L-level as described before, the output signal of inverter 216 attains the L-level. In response to this, the output signal of NAND gate 218 attains the H-level.

When signal /CAS subsequently attains the L-level, the output signal of inverter 203 attains the H-level, and the output signal of NAND gate 217 attains the L-level in response to this. Thereby, signal EWU attains the H-level, so that the early write mode related to signal /UW is detected.

Figure 3:
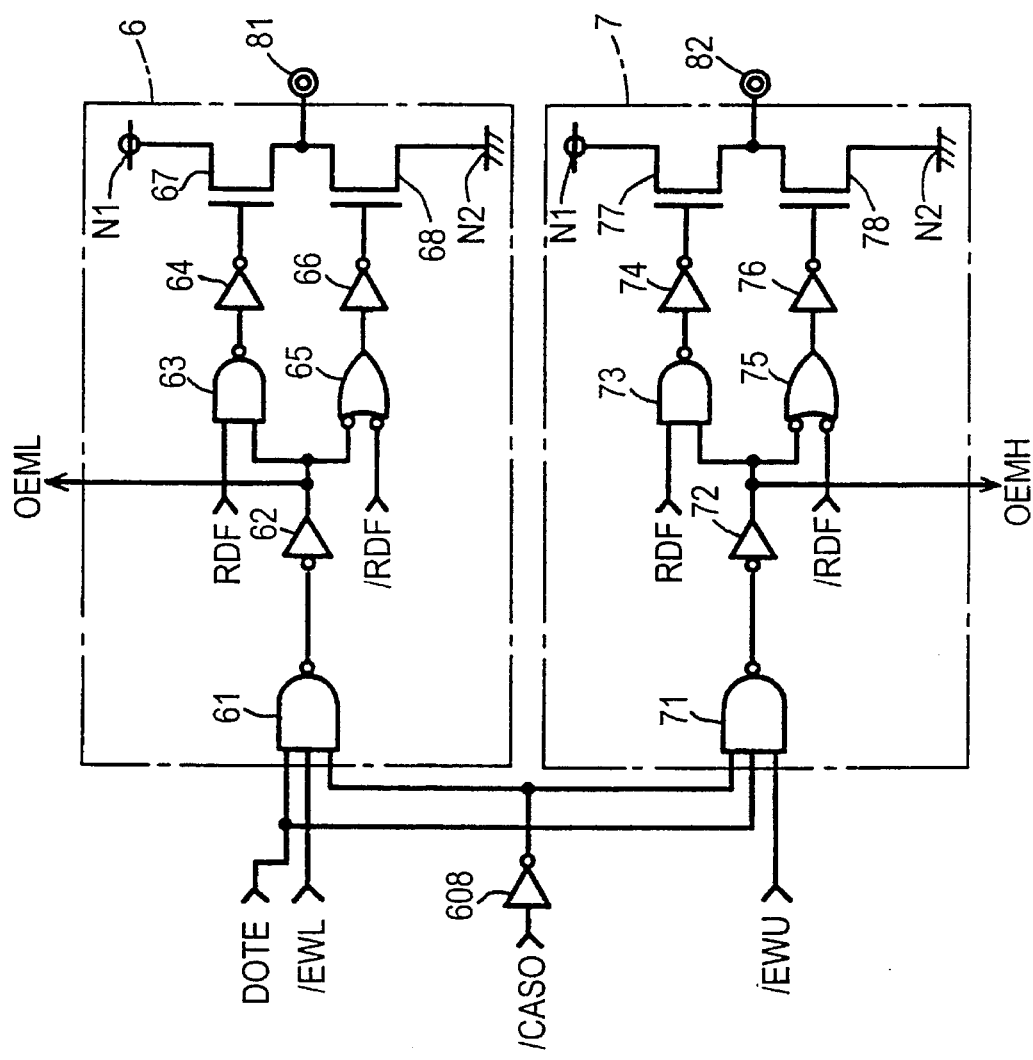
FIG. 3 is a circuit diagram of lower and upper output buffers in FIG. 1.

Then, the lower and upper output buffers 6 and 7 in FIG. 1 will be described below. FIG. 3 is a circuit diagram of lower and upper output buffers 6 and 7 in FIG. 1. In FIG. 3, portions similar to those in FIG. 15 bear the same reference numbers, and will not be described below.

Referring to FIG. 3, lower and upper output buffers 6 and 7 differ from those in FIG. 15 in the following points.

Figure 15:
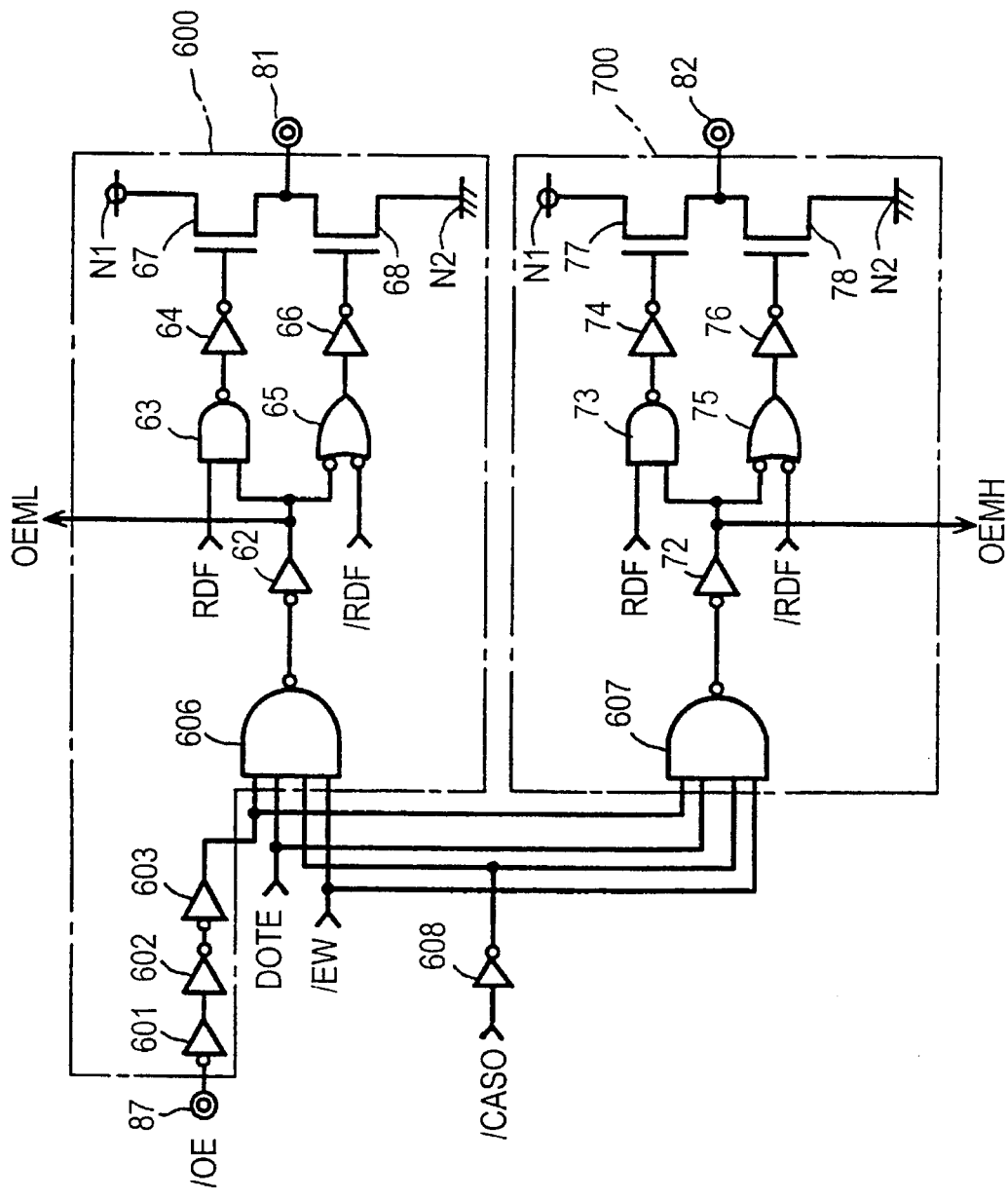
FIG. 15 is a circuit diagram of conventional upper and lower output buffers for executing an early write mode.

Lower and upper output buffers 6 and 7 in FIG. 3 are not provided with inverters 601–603 shown in FIG. 15. Further, lower output buffer 6 in FIG. 3 is provided with a 3-input NAND gate 61 instead of NAND gate 606 shown in FIG. 15. Moreover, upper output buffer 7 in FIG. 3 is provided with a 3-input NAND gate 71 instead of NAND gate 607 shown in FIG. 15.

NAND gate 61 in lower output buffer 6 receives on its input terminals a signal produced by inverting signal /CAS0 by inverter 608, signal /EWL at a level equal to the inverted level of signal EWL and signal DOTE. NAND gate 71 of upper output buffer 7 receives on its input terminals the signal produced by inverting signal /CAS0 by inverter 608, signal /EWU of a level equal to the inverted level of signal EWU, and signal DOTE.

Description will now be given on the operation of each of lower and upper output buffers 6 and 7. First, the operation of lower output buffer 6 will be described below.

In lower output buffer 6, all the input signals of NAND gate 61 are at the H-level and the output signal thereof is at the L-level, when both signals DOTE and /EWL are at the H-level and the signal /CAS0 is at the L-level. Thus, the output signal of NAND gate 61 attains the L-level when DRAM 101 is internally ready to read data therefrom, the early write mode related to the lower side is not designated and signal /CAS attains the L-level.

In this case, since the output signal of inverter 62 attains the H-level, signal OEML attains the H-level, and read data RDF is transmitted to lower data I/O terminal group 81. The operation of transmitting data in this case is the same as that already described with reference to FIG. 15, and hence will not be described below.

Meanwhile, when the early write mode related to signal /LW is detected, signal /EWL attains the L-level, so that the output signal of NAND gate 61 attains the H-level. In this case, since the output signal of inverter 62 attains the L-level, signal OEML attains the L-level, so that read data RDF is not transmitted to upper data I/O terminal group 81. In this case, upper data I/O terminal group 81 attains the high impedance state.

The operation of upper output buffer 7 is similar to that of lower output buffer 6 and will be briefly described below.

When DRAM 101 is internally ready to read data, the early write mode related to signal /UW is not designated and signal /CAS attains the L-level, all the input signals of NAND gate 71 attain the H-level. Therefore, the output signal of NAND gate 71 attains the L-level. In this case, signal OEMH attains the H-level, and read data RDF is transmitted to upper data I/O terminal group 82.

When the early write mode related to signal /UW is designated, signal /EWU attains the L-level, so that the output signal of NAND gate 71 attains the H-level. In this case, signal OEMH attains the L-level, so that read data RDF is not transmitted to upper data I/O terminal group 82. In this case, upper data I/O terminal group 82 attains the high impedance state.

Figure 4:
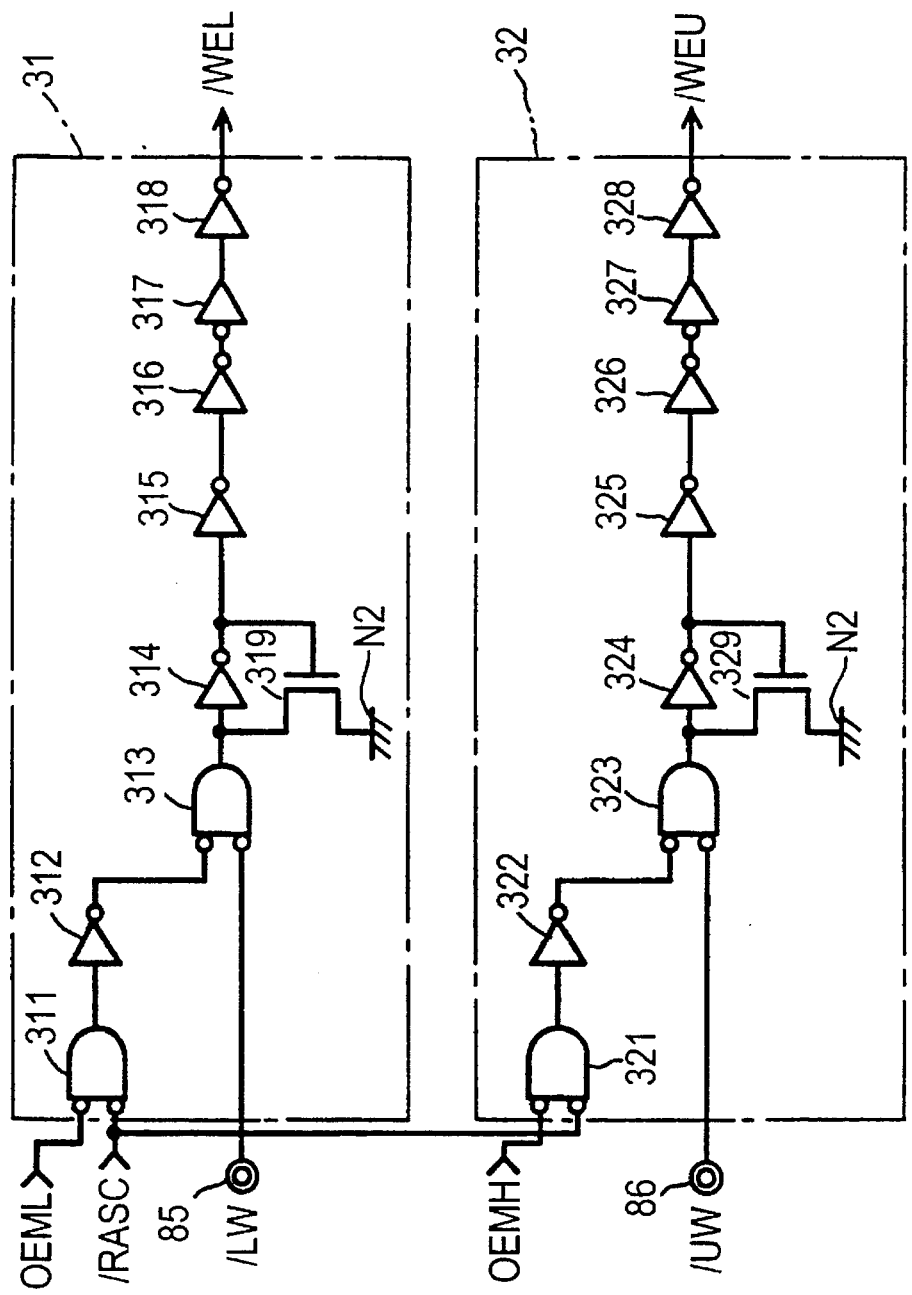
FIG. 4 is a circuit diagram of a write control circuit in FIG. 1.
Figure 16:
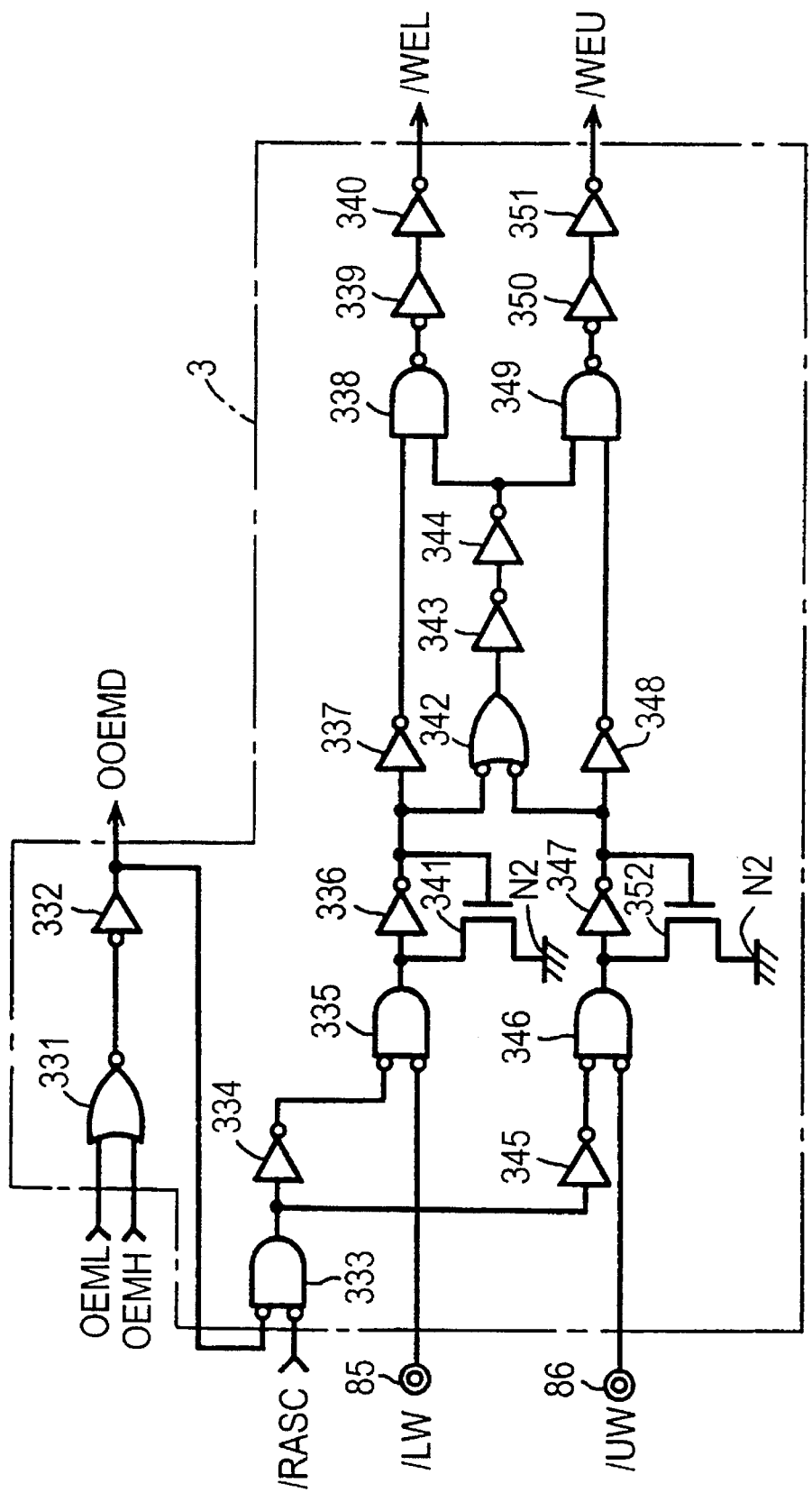
FIG. 16 is a circuit diagram of a conventional write control circuit for executing an early write mode.

Then, write control circuits 31 and 32 in FIG. 1 will be described below. FIG. 4 is a circuit diagram of write control circuits 31 and 32 in FIG. 1. The structure in FIG. 4 differs from that in FIG. 16 in that there are provided two write control circuits 31 and 32.

Referring to FIG. 4, write control circuit 31 includes NOR gates 311 and 313, inverters 312, 314–318 and an N-channel MOS transistor 319. Write control circuit 32 includes NOR gates 321 and 323, inverters 322, 324–328 and an N-channel MOS transistor 329.

In write control circuit 31, NOR gate 311 receives signal OEML on one of its input terminals, and receives signal /RASC on the other input terminal. The output signal of NOR gate 311 is applied to one of input terminals of NOR gate 313 through inverter 312. Signal /LW is applied to the other input terminal of NOR gate 313.

The output signal of NOR gate 313 is output as signal /WEL through inverters 314–318. Transistor 319 is connected between ground node N2 and a node formed between the output terminal of NOR gate 313 and the input terminal of inverter 314. Transistor 319 receives on its gate electrode the output signal of inverter 314.

In write control circuit 32, NOR gate 321 receives signal OEMH on one of its input terminals, and receives signal /RASC on the other input terminal. The output signal of NOR gate 321 is applied to one of its input terminals through inverter 322. Signal /UW is applied to the other input terminal of NOR gate 323.

The output signal of NOR gate 323 is output as signal /WEU through inverters 324–328. Transistor 329 is connected between ground node N2 and a node formed between the output terminal of NOR gate 323 and the input terminal of inverter 324. Transistor 329 receives on its gate electrode the output signal of inverter 324.

Description will be given on operations of write control circuits 31 and 32. First, the operation of write control circuit 31 will be described below. When signal OEML is at the H-level (i.e., when lower output buffer 6 is performing the read operation), or when signal /RAS is at the H-level (i.e., when signal /RAS is at the H-level), the output signal of NOR gate 311 is at the L-level.

In this case, the output signal of NOR gate 313 is necessarily at the L-level, so that signal /WEL is at the H-level. In this case, the lower input buffer 4 is not set to the write operation state.

Meanwhile, when both signals OEML and /RASC are at the L-level (i.e., when lower output buffer 6 is not performing the read operation and signal /RAS is at the L-level), the output signal of NOR gate 311 is at the H-level. In this case, the output signal of NOR gate 313 attains the level equal to the inverted level of signal /LW. Therefore, when signal /LW attains the L-level, the output signal of NOR gate 313 attains the H-level, so that signal /WEL attains the L-level. In this case, lower input buffer 4 is set to the write operation state, and takes in data sent from lower data I/O terminal group 81.

Then, the operation of write control circuit 32 will be described below. Since write control circuit 32 has the structure similar to that of write control circuit 31, it operates similarly to write control circuit 31. Accordingly, specific operation of write control circuit 32 will not be described below, and only a relationship between the input and output signals of write control circuit 32 will be described below.

In write control circuit 32, when signal OEMH is at the H-level (i.e., when upper output buffer 7 is performing the read operation), or when signal /RASC is at the H-level (i.e., when signal /RAS is at the H-level), signal /WEU output therefrom is at the H-level. In this case, upper input buffer 5 receiving signal /WEU is not set to the write operation state.

Meanwhile, when both signals OEMH and /RAS are at the L-level (i.e., when upper output buffer 7 is not performing the read operation, and signal /RAS is at the L-level), output signal /WEU is at the L-level. In this case, upper input buffer 5 is set to the write operation state and takes in data sent from upper data I/O terminal group 82.

Figure 5:
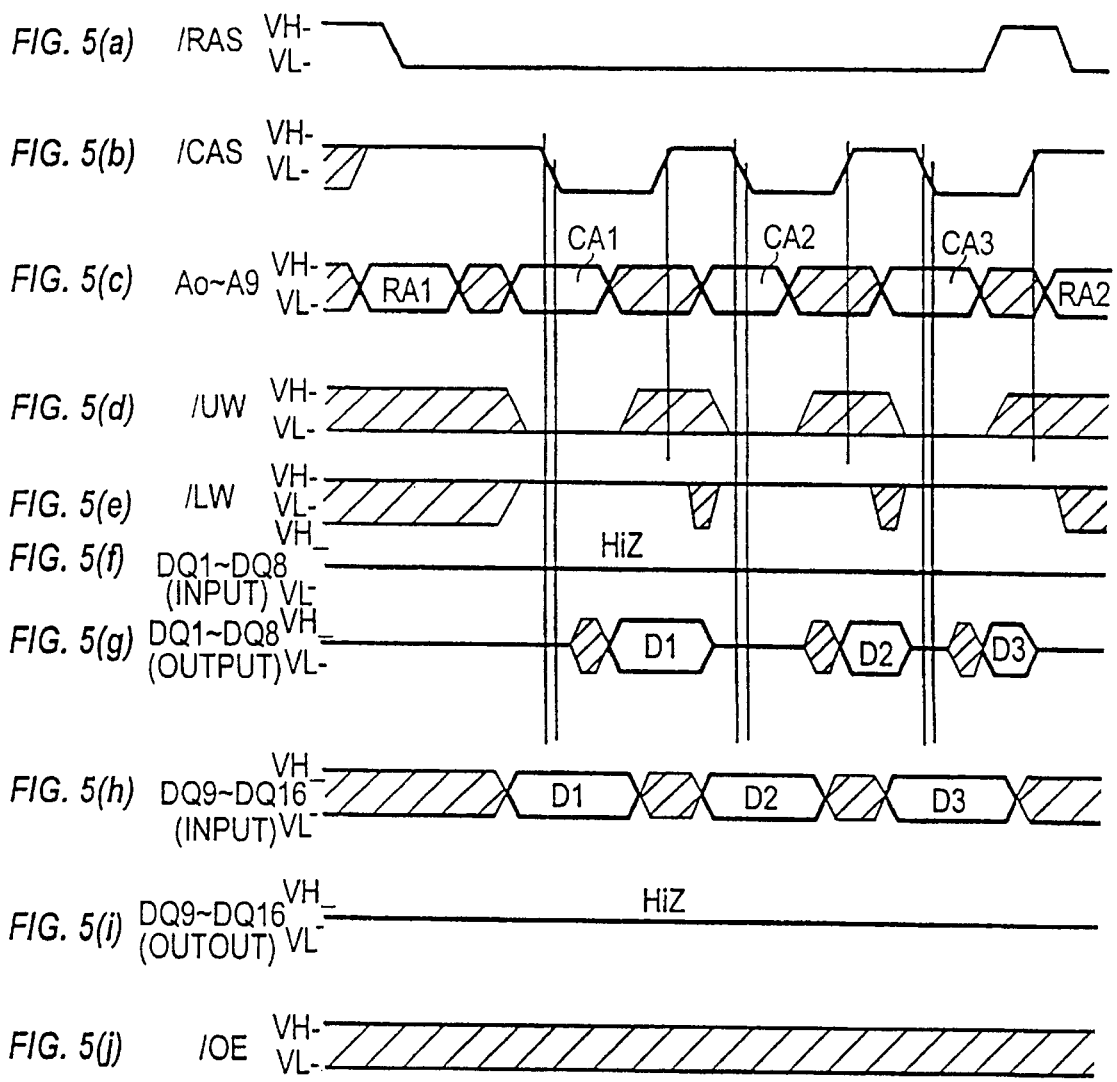
FIGS. 5(a)–5(j) are timing charts showing operation in an early write mode of the DRAM of the first embodiment.

Description will now be given on the operation in the early write mode of DRAM 101 shown in FIGS. 1 to 4. FIG. 5 is a timing chart showing operation in the early write mode of DRAM 101 shown in FIGS. 1 to 4. More specifically, FIG. 5 shows the operation of executing the early write mode in accordance with a fast page mode byte control cycle.

FIG. 5 shows the same signals and data as those in FIG. 17. The operation in FIG. 5 will be described below only in connection with a difference with respect to the operation in FIG. 17.

The operation in FIG. 5 differs from that in FIG. 17 in the following points. When upper data I/O terminal group 82 is used for writing data in response to signal /UW, lower data I/O terminal group 81 is concurrently used for reading data. This state is represented by the fact that effective data D1–D3 appear on output data DQ1–DQ8 in FIG. 5.

The above state is achieved by the following operation. Detecting circuit 200B in early write detecting circuit 200 in FIG. 2 detects the early write mode responsive to signal /UW, and signal EWU attains the H-level. Therefore, upper output buffer 7 in FIG. 3 is not set to the read operation state. Therefore, signal OEMH attains the L-level, and the upper data I/O terminal group 82 attains the high impedance state HiZ.

In the write control circuit 32 receiving signal OEMH at the L-level, signal /WEU attains the L-level when both signals OEMH and /RASC attain the L-level and signal /UW attains the L-level. At this time, upper input buffer 5 in FIG. 1 is set to the write operation state.

In this case, however, detecting circuit 200A in early write detecting circuit 200 in FIG. 2 does not detect the early write mode corresponding to signal /LW. Therefore, signal EWL is at the L-level. In lower output buffer 6 in FIG. 3, therefore, signals DOTE and /EWL attain the H-level, and, at the time that signal /CAS0 attains the L-level, signal OEML attains the H-level so that the read operation state is set.

In write control circuit 31 receiving signal OEML at the H-level, signal /WEL attains the H-level. Therefore, the lower input buffer 4 in FIG. 1 is not set to the write operation state.

As a result of the above operation, while one of lower and upper data I/O terminal groups 81 and 82 is used to perform the read operation, the other of lower and upper data I/O terminal groups 81 and 82 is used to perform the write operation.

Accordingly, the DRAM of the first embodiment can improve the data processing speed.

Description will now be given on an advantage achieved by executing the control for simultaneously performing the write operation and the read operation in the early write mode as described above.

Circuits for performing the above control in the early write mode can be formed utilizing the conventional circuits shown in FIGS. 13 to 16 for executing the early write mode.

In the early write mode, it is possible to determine, at an initial stage in the operation cycle, whether execution of the write operation is to be designated or not. Therefore, it is not necessary to defer determination whether the write operation will be designated or not. Therefore, the DRAM of the first embodiment does not require a circuit for holding a signal which was previously input for later execution of the above determination. Therefore, the structure of circuitry can be more simple than the case where such a control is performed in another mode.

FIG. 5 shows the case where the early write mode is executed by the DRAM of the first embodiment in accordance with the fast page mode byte control cycle. Alternatively, the early write mode may be executed in accordance with the normal mode byte control cycle.

Figure 6:
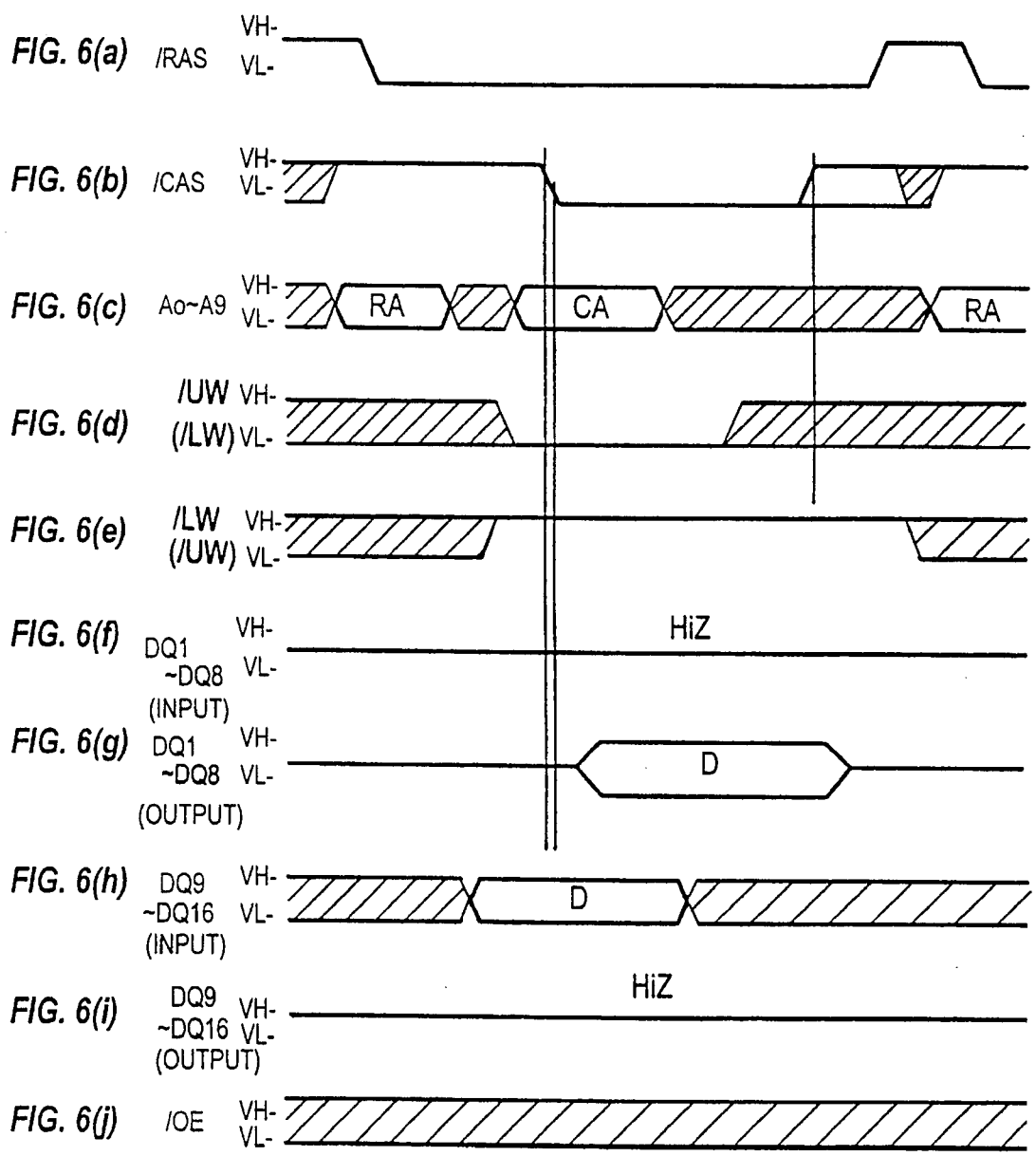
FIGS. 6(a)–6(j) are timing charts showing operation when performing the early write mode by the DRAM of the first embodiment in accordance with a normal mode byte control.

FIG. 6 is a timing chart showing the operation of executing the early write mode by the DRAM of the first embodiment in accordance with the normal mode byte control cycle.

In the normal mode byte control cycle, as shown in FIG. 6, signal /CAS is lowered only one time during a period of one cycle of signal /RAS. The operation of DRAM 101 in this case is the same as that already described. In this normal mode byte control cycle, as shown in FIG. 6, simultaneous execution of the write and read operations occurs only one time during a period of one cycle of signal /RAS.

As described above, the early write mode by the DRAM of the first embodiment can be executed also in accordance with the normal mode byte control cycle. Therefore, the DRAM of the first embodiment can improve the data processing speed at the normal mode byte control cycle.

Second Embodiment

A second embodiment will be described below. The following description will be given on an example that the second embodiment allows simultaneous execution of the write and read operations, as is done in the first embodiment, and further allows selective execution of the read operation.

Figure 7:
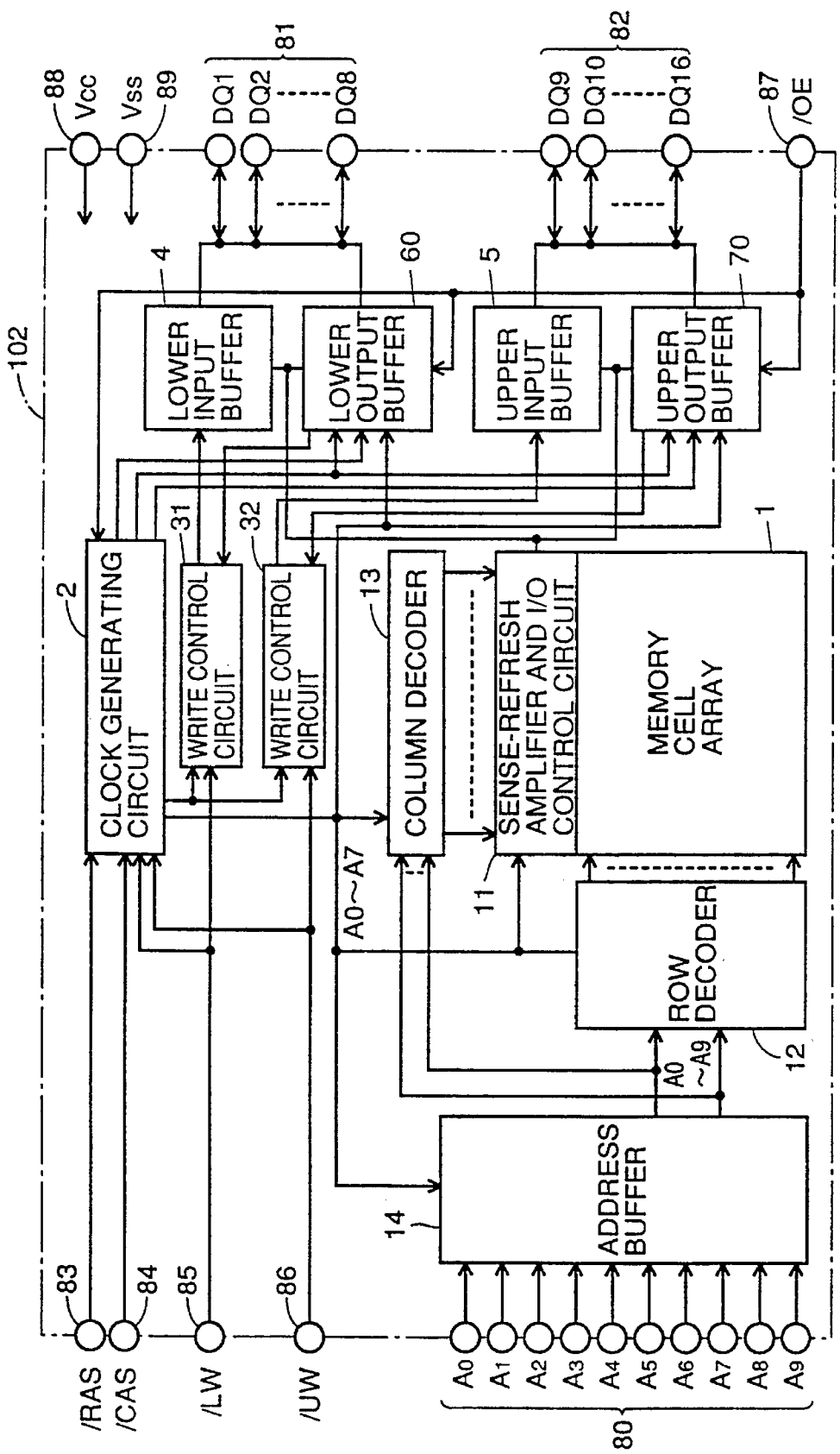
FIG. 7 is a block diagram showing a whole structure of a DRAM of a second embodiment.

FIG. 7 is a block diagram showing a whole structure of a DRAM of the second embodiment. In FIG. 7, portions similar to those in FIG. 1 bear the same reference numbers, and will not be described later.

The DRAM 102 in FIG. 7 differs from that in FIG. 1 in the following points. Each of lower and upper output buffers 60 and 70 receives output enable signal /OE. Further, lower and upper output buffers 60 and 70 receiving output enable signal /OE have structures different from those in FIG. 1.

Figure 8:
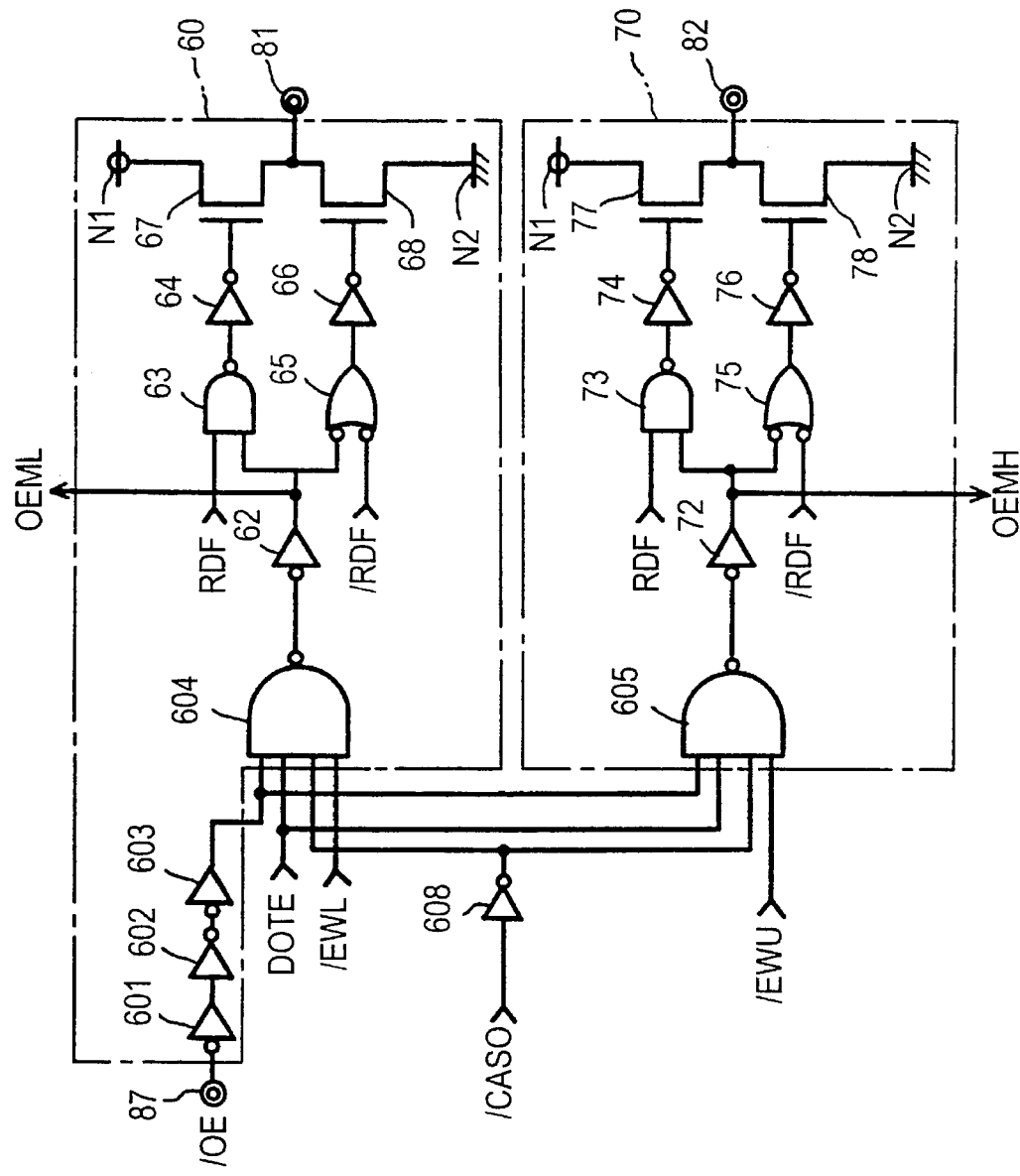
FIG. 8 is a circuit diagram of lower and upper output buffers in FIG. 7.

Description will be given on the structures of the lower and upper output buffers 60 and 70, which are distinctive features of DRAM 102 of the second embodiment. FIG. 8 is a circuit diagram of the lower and upper output buffers 60 and 70 in DRAM 102 in FIG. 7. In FIG. 8, portions similar to those in FIG. 3 bear the same reference numbers, and will not be described later.

The lower and upper output buffers 60 and 70 in FIG. 8 differ from those in FIG. 3 in the following points.

In lower output buffer 60, NAND gate 61 shown in FIG. 3 is replaced with a 4-input NAND gate 604. In upper output buffer 70, NAND gate 71 shown in FIG. 3 is replaced with a 4-input NAND gate 605. On one of its input terminals, each of NAND gates 604 and 605 receives output enable signal /OE through inverters 601–603. The foregoing is the difference.

Operation of the lower and upper output buffers 60 and 70 will be described below. In particular, the following description will be mainly given on differences in operation with respect to the lower and upper output buffers 6 and 7 shown in FIG. 3.

In lower output buffer 60, when both signals /EWL and DOTE are at the H-level and both signals /CAS0 and /OE are at the L-level, all the input signals of NAND gate 604 are at the H-level. In this case, the output signal of NAND gate 604 is at the L-level.

The above case corresponds to the state that signal /OE is at the L-level in such a state that reading of data is internally ready, the early write mode responsive to signal /LW is not detected and signal /CAS is at the L-level.

In this case, signal OEML is at the H-level, and, in response to this, read data RDF is transmitted to lower data I/O terminal group 81. Thus, lower output buffer 60 is not set to the data read operation state unless signal /OE attains the L-level.

Meanwhile, when signal /EWL among signals supplied to NAND gate 604 is at the L-level, i.e., when the early write mode responsive to signal /LW is detected, the output signal of NAND gate 604 is at the H-level. In this case, signal OEML is at the L-level, and read data RDF is not transmitted to lower data I/O terminal group 81. Therefore, lower data I/O terminal group 81 is set to the high impedance state.

Operation of upper output buffer 70 will be described below. Upper output buffer 70 has a structure similar to that of lower output buffer 60, and thus operates in a similar manner. More specifically, when both signals /EWU and DOTE are at the H-level, and both signals /CAS0 and /OE at the L-level, the output signal of NAND gate 605 is at the L-level. In this case, signal OEMH is at the H-level, and, in response to this, read data RDF is transmitted to upper data I/O terminal group 82.

When signal /EWU among signals supplied to NAND gate 605 is at the L-level, i.e., when the early write mode related to signal /UW is detected, the output signal of NAND gate 605 is at the H-level. In this case, signal OEMH is at the L-level, and read data RDF is not transmitted to upper data I/O terminal group 82. Thus, upper data I/O terminal group 82 is set to the high impedance state.

The distinctive feature of the lower and upper output buffers 60 and 70 is that, when the early write mode is not detected, signal /OE determines whether the read operation state is to be set or not.

In DRAM 101 of the first embodiment, when write operation is performed using one of lower and upper data I/O terminal groups 81 and 82 in the early write mode, read operation using the other group is necessarily performed.

In contrast to this, DRAM 102 of the second embodiment in the early write mode uses signal /OE to determine whether the data I/O terminal group not used for the write operation is to be used for the read operation or not.

Therefore, the level of signal /OE in the early write mode must be set taking the following points into consideration. In the early write mode, when the read operation is not to be performed simultaneously with the write operation, signal /OE is set to the H-level. Meanwhile, in the early write mode, when the write operation is to be executed simultaneously with the read operation, signal /OE is set to the L-level.

Operation in the early write mode of DRAM 102 shown in FIGS. 7 and 8 will be described below. First, description will be given on the operation of DRAM 102 for executing simultaneously the write and read operations. FIG. 9 is a timing chart showing the operation of simultaneously performing the write and read operations in the early write mode of DRAM 102 of the second embodiment.

Particularly, FIG. 9 shows the operation in the case where the early write mode is executed in accordance with the fast page mode byte control cycle. FIG. 9 shows signals and data similar to those in FIG. 5.

The following description will be given mainly on a difference in operation between FIGS. 9 and 5. The operation in FIG. 9 differs from the operation in FIG. 5 in that signal /OE is at the L-level. Signal /OE is set to the L-level for controlling the circuitry to perform simultaneously the write and read operations in the early write mode.

In this case, therefore, operation is performed similarly to that in FIG. 5, and more specifically, the write operation using upper data I/O terminal group 82 is performed simultaneously with the read operation using lower data I/O terminal group 81. Therefore, DRAM 102 of the second embodiment can improve the data processing speed.

Description will now be given on the operation of performing only the write operation without performing the read operation in the early write mode. FIG. 10 is a timing chart showing the operation of performing only the write operation without performing the read operation in the early write mode of DRAM 102 of the second embodiment 102.

Particularly, FIG. 10 shows the operation in the case where the early write mode is executed in accordance with the fast page mode byte control cycle. FIG. 10 shows signals and data similar to those in FIG. 17.

The following description related to FIG. 10 will be given mainly on the operation different from that in FIG. 17. The operation in FIG. 10 differs from that in FIG. 17 in that signal /OE is at the H-level. Signal /OE is set to the H-level for controlling the circuitry to perform only the write operation without performing the read operation.

In this case, therefore, the operation is performed similarly to the operation in FIG. 17 of performing only the write operation using upper data I/O terminal group 82.

As described above, only the write operation is performed without performing the read operation in the early write mode of DRAM 102 of the second embodiment, and the operation in this manner is executed, for example, in such a case that it is necessary or desired not to externally output unnecessary data in view of data exchange with respect to another DRAM chip.

The operation of the second embodiment has been described in connection with the case where the early write mode is executed in accordance with the fast page mode byte control cycle. However, DRAM 102 of the second embodiment can execute the early write mode in accordance with the normal mode byte control cycle.

Description will now be given on the operation of DRAM 102 of executing the early write mode in accordance with the normal mode byte control cycle.

First, description will be given on the operation of DRAM 102 in which the write and read operations are simultaneously executed when executing the early write mode in accordance with the normal mode byte control cycle.

FIG. 11 is a timing chart showing the operation of performing simultaneously the write and read operations when DRAM 102 of the second embodiment executes the early write mode in accordance with the normal mode byte control cycle. FIG. 11 shows signals and data similar to those in FIG. 6.

The following description of FIG. 11 will be given mainly on a difference with respect to the operation in FIG. 6. The operation in FIG. 11 differs from the operation in FIG. 6 in that signal /OE is at the L-level. The L-level of signal /OE is set for controlling the circuitry to execute simultaneously the write and read operations in the early write mode executed in accordance with the normal mode byte control cycle.

In this case, therefore, the operation is performed similarly to the operation in FIG. 6 of simultaneously executing the write operation with upper data I/O terminal group 82 and the read operation with lower data I/O terminal group 81. Therefore, DRAM 102 of the second embodiment can improve the data processing speed in the normal mode byte control cycle.

Then, description will be given on the operation of DRAM 102 in the case where only the write operation is performed without performing the read operation when executing the early write mode in accordance with the normal mode byte control cycle.

FIG. 12 is a timing chart showing the operation of performing only the write operation without performing the read operation when executing the early write mode of DRAM 102 of the second embodiment in accordance with the normal mode byte control cycle. FIG. 12 shows signals and data similar to those in FIG. 11.

The following description of FIG. 12 will be given mainly on a difference with respect to that in FIG. 11. The operation in FIG. 12 differs from that in FIG. 11 in the following point.

The difference is that signal /OE is set to the H-level. In order to control the circuitry to perform only the write operation without performing the read operation in the early write mode, signal /OE is set to the H-level as described above.

In this case, lower output buffer 60 in FIG. 8 is not set to the read operation state. Therefore, lower output data DQ1–DQ8 in lower data I/O terminal group 81 to which lower output buffer 60 outputs data are set to the high impedance state HiZ. In this case, therefore, only the write operation using upper data I/O terminal group 82 is executed.

As described above, only the write operation is performed without performing the read operation when executing the early write mode of DRAM 102 of the second embodiment in accordance with the normal mode byte control cycle, and the operation in this manner is executed, for example, in such a case that it is necessary or desired not to externally output unnecessary data in view of data exchange with respect to another DRAM chip, which is similar to the case already described.

As described above, DRAM 102 of the second embodiment has such a structure that simultaneous execution of the write and read operations is allowed in the early write mode, and the determination whether the read operation is executed or not is performed depending on signal /OE.

According to DRAM 102 of the second embodiment, therefore, the read and write operations can be executed simultaneously in the early write mode. Therefore, data can be output in the early write mode only when data is to be output. Thereby, a possibility of collision of data in the data I/O terminals can be eliminated. Further, output of data can be prevented in the case where it is necessary or desired not to externally output unnecessary data in view of data exchange with respect to another DRAM chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device wherein an early write mode activating a write operation can be executed by changing a write designating signal for designating the write operation after change of a row address strobe signal for taking in a row address and before change of a column address strobe signal for taking in a column address, said semiconductor memory device comprising:

a plurality of data I/O terminal groups divided into a plurality of groups each forming a unit for performing input and output of data;

a plurality of write designating signal input terminals receiving a plurality of write designating signals generated correspondingly to said plurality of data I/O terminal groups for selectively designating said data I/O terminal group used for writing the data, respectively;

early write detecting means receiving said row address strobe signal, said column address strobe signal and said plurality of write designating signals, and being responsive to the received signals by operating for each of said data I/O terminal groups to detect designation of said early write mode using each of said data I/O terminal groups;

a plurality of write means provided correspondingly to said plurality of data I/O terminal groups, respectively, and each receiving said write designation signal for the corresponding data I/O terminal group to perform control for using the corresponding data I/O terminal group for writing the data when said received write designation signal designates the corresponding data I/O terminal group; and a plurality of read means provided correspondingly to said plurality of data I/O terminal groups, respectively, and each performing control for using the corresponding data I/O terminal group for reading the data when said early write detecting means does not detect the designation of said early write mode for the corresponding data I/O terminal group.

2. The semiconductor memory device according to claim 1, wherein said early write detecting means includes a plurality of detecting means provided correspondingly to said plurality of data I/O terminal groups, respectively, and said plurality of detecting means receive said row address strobe signal, said column address strobe signal and the corresponding write designating signals and are responsive to the received signals to detect designation of said early write mode for the corresponding data I/O terminal groups.

3. The semiconductor memory device according to claim 1, wherein each of said plurality of write means includes:

write control means receiving said write designation signal for the corresponding data I/O terminal group, and outputting a write control signal for designating use of the corresponding I/O terminal group for the data writing when the received signal designates said corresponding data I/O terminal group; and input buffer means receiving said write control signal from said write control means for the corresponding I/O terminal group, and receiving the data sent from the corresponding I/O terminal group when said received signal designates the use of said corresponding I/O terminal group for the data writing.

4. The semiconductor memory device according to claim 1, wherein each of said plurality of read means includes output buffer means receiving data to be read and applying said received data to the corresponding I/O terminal group.

5. The semiconductor memory device according to claim 1, wherein said input row address strobe signal and said input column address strobe signal define access in accordance with a normal mode cycle such that said column address strobe signal performs change of one cycle during a period of one cycle of change of said row address strobe signal.

6. The semiconductor memory device according to claim 1, wherein said input row address strobe signal and said input column address strobe signal define access in accordance with a fast page mode cycle and a similar cycle such that said column address strobe signal performs change of multiple cycles during a period of one cycle of change of said row address strobe signal.

7. The semiconductor memory device according to claim 1, wherein said plurality of data I/O terminal groups includes an upper data I/O terminal group for performing input/ output of data of upper bits, and a lower data I/O terminal group for performing input/output of data of lower bits.

8. A semiconductor memory device wherein an early write mode activating a write operation can be executed by changing a write designating signal for designating the write operation after change of a row address strobe signal for taking in a row address and before change of a column address strobe signal for taking in a column address, said semiconductor memory device comprising:

a plurality of data I/O terminal groups divided into a plurality of groups each forming a unit for performing input and output of data;

a plurality of write designating signal input terminals receiving a plurality of write designating signals generated correspondingly to said plurality of data I/O terminal groups for selectively designating said data I/O terminal group used for writing the data, respectively;

an output enable signal input terminal receiving an output enable signal enabling external output of data;

early write detecting means receiving said row address strobe signal, said column address strobe signal and said plurality of write designating signals, and being responsive to the received signals by operating for each of said data I/O terminal groups to detect designation of said early write mode using each of said data I/O terminal groups;

a plurality of write means provided correspondingly to said plurality of data I/O terminal groups, respectively, and each receiving said write designation signal for the corresponding data I/O terminal group to perform control for using the corresponding data I/O terminal group for writing the data when said received write designation signal designates the corresponding data I/O terminal group; and a plurality of read means provided correspondingly to said plurality of data I/O terminal groups, respectively, and each performing control for using the corresponding data I/O terminal group for reading the data when said early write detecting means does not detect the designation of said early write mode for the corresponding data I/O terminal group and said output enable signal enables output of data.

9. The semiconductor memory device according to claim 8, wherein said early write detecting means includes a plurality of detecting means provided correspondingly to said plurality of data I/O terminal groups, respectively, and said plurality of detecting means receive said row address strobe signal, said column address strobe signal and the corresponding write designating signals and are responsive to the received signals to detect designation of said early write mode for the corresponding data I/O terminal groups.

10. The semiconductor memory device according to claim 8, wherein each of said plurality of write means includes:

write control means receiving said write designation signal for the corresponding data I/O terminal group, and outputting a write control signal for designating use of the corresponding I/O terminal group for the data writing when the received signal designates said corresponding data I/O terminal group; and input buffer means receiving said write control signal from said write control means for the corresponding I/O terminal group, and receiving the data sent from the corresponding I/O terminal group when said received signal designates the use of said corresponding I/O terminal group for the data writing.

11. The semiconductor memory device according to claim 8, wherein each of said plurality of read means includes output buffer means receiving data to be read and applying said received data to the corresponding I/O terminal group.

12. The semiconductor memory device according to claim 8, wherein said input row address strobe signal and said input column address strobe signal define access in accordance with a normal mode cycle such that said column address strobe signal performs change of one cycle during a period of one cycle of change of said row address strobe signal.

13. The semiconductor memory device according to claim 8, wherein said input row address strobe signal and said input column address strobe signal define access in accordance with a fast page mode cycle and a similar cycle such that said column address strobe signal performs change of multiple cycles during a period of one cycle of change of said row address strobe signal.

14. The semiconductor memory device according to claim 8, wherein said plurality of data I/O terminal groups includes an upper data I/O terminal group for performing input/output of data of upper bits, and a lower data I/O terminal group for performing input/output of data of lower bits.

* * * * *